(12) United States Patent
Tassev et al.

(10) Patent No.: US 11,646,201 B1
(45) Date of Patent: May 9, 2023

(54) METHOD FOR FABRICATION OF ORIENTATION-PATTERNED TEMPLATES ON COMMON SUBSTRATES

(71) Applicant: Government of the United States, as represented by the Secretary of the Air Force, Wright-Patterson AFB, OH (US)

(72) Inventors: Vladimir Tassev, Beavercreek, OH (US); Shivashankar Vangala, Mason, OH (US); David H Tomich, New Carlisle, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 115 days.

(21) Appl. No.: 17/346,642

(22) Filed: Jun. 14, 2021

Related U.S. Application Data

(62) Division of application No. 16/447,677, filed on Jun. 20, 2019, now Pat. No. 11,087,975.

(51) Int. Cl.
*H01L 21/02* (2006.01)
(52) U.S. Cl.
CPC .. *H01L 21/02516* (2013.01); *H01L 21/02502* (2013.01); *H01L 21/02609* (2013.01); *H01L 21/0254* (2013.01); *H01L 21/02667* (2013.01)

(58) Field of Classification Search
None
See application file for complete search history.

(56) References Cited

U.S. PATENT DOCUMENTS

| 2006/0057749 | A1* | 3/2006 | Dwilinski | C30B 29/403 438/22 |
| 2010/0212729 | A1 | 8/2010 | Hsu | |
| 2020/0251604 | A1 | 8/2020 | McGlynn et al. | |

OTHER PUBLICATIONS

Hellman, "The Polarity of GaN: a Critical Review", MRS Internet J. Nitride Semicond. Res. 3, 11 (1998). 1 © 1998-1999 The Materials Research Society. (Year: 1998).*

(Continued)

*Primary Examiner* — Asok K Sarkar
(74) *Attorney, Agent, or Firm* — AFMCLO/JAZ; Timothy M. Barlow

(57) ABSTRACT

A method for preparation of orientation-patterned (OP) templates comprising the steps of: depositing a first layer of a first material on a common substrate by a far-from-equilibrium process; and depositing a first layer of a second material on the first layer of the first material by a close-to-equilibrium process, wherein a first assembly is formed. The first material and the second material may be the same material or different materials. The substrate material may be $Al_2O_3$ (sapphire), silicon (Si), germanium (Ge), GaAs, GaP, GaSb, InAs, InP, CdTe, CdS, CdSe, or GaSe. The first material deposited on the common substrate may be one or more electronic or optical binary materials from the group consisting of AlN, GaN, GaP, InP, GaAs, InAs, AlAs, ZnSe, GaSe, ZnTe, CdTe, HgTe, GaSb, SiC, CdS, CdSe, or their (Continued)

ternaries or quaternaries. The far-from-equilibrium process is one of MOCVD and MBE, and the close-to-equilibrium process is HVPE.

**12 Claims, 19 Drawing Sheets
(18 of 19 Drawing Sheet(s) Filed in Color)**

(56) References Cited

OTHER PUBLICATIONS

Hayashi et al., "Polarity inversion of aluminum nitride by direct wafer bonding"., Applied Physics Express 11, 031003 (2018). (Year: 2018).*
Stutzmann et al., "Playing with Polarity", phys.stat.sol.(b) 228, No. 2, 505-512 (2001). (Year: 2001).*
Qin, Y., et al., Low-Temperature Bonding for Silicon-Based Micro-Optical Systems, Photonics 2015, 2, 1164-1201; doi:10.3390/photonics2041164.
Vangala, S., et al., Thick orientation-patterned growth of GaP on wafer-fused GaAs templates by hydride vapor phase epitaxy for frequency conversion, Optical Materials 60 (2016) 62-66.
Tassev, V, et al., Progress in orientation-patterned GaP for next-generation nonlinear optical devices, Proc. of SPIE vol. 8604 86040V-9.
Termkoa, K., et al., Production of orientation-patterned GaP templates using wafer fusion techniques, Optical Materials 34(2011) 30-35.
Grassman, T.J., et al., Nucleation-related defect-free GaP/Si(100) heteroepitaxy via metal-organic chemical vapor deposition, Applied Physics Letters 102, 142102 (2013); doi: 10.1063/1.4801498.
Soga, T., et al., MOCVD Growth and Characterization of GaAs and GaP Grown on Si Substrates, Journal of Crystal Growth 93 (1988) 499-503.
Grisard, A., et al., Quasi-phase-matched gallium arsenide for versatile mid-infrared frequency conversion, Optical Materials Express 1020, Aug. 1, 2012, vol. 2, No. 8.
Ebert, C.B., et al., MBE growth of antiphase GaAs lms using GaAs/Ge/GaAs heteroepitaxy, Journal of Crystal Growth 201/202 (1999) 187) 193.
Paskova, T., et al., Hydride Vapour Phase Homoepitaxial Growth of GaN on MOCVD-Grown 'Templates', https://doi.org/10.1557/S109257830000418X.
Tassev, V., et al., HVPE growth and characterization of GaP on different substrates and patterned templates for frequency conversion devices, Journal of the European Optical Society—Rapid Publications 6, 11017 (2011).
Tassev, V., Heteroepitaxy, an Amazing Contribution of Crystal Growth to the World of Optics and Electronics, Crystals 2017, 7, 178; doi:10.3390/cryst7060178.
Tassev, V., et al., Heteroepitaxial growth of OPGaP on OPGaAs for frequency conversion in the IR and THz, Optical Materials Express 1724, May 1, 2016 | vol. 6, No. 5 | DOI:10.1364/OME.6.001724.
Gonda, S., et al., Heteroepitaxial Growth of GaP on Silicon by Molecular Beam Epitaxy, Japanese Journal of Applied Physics, vol. 17, No. 6, Jun. 1978, pp. 1043-1048.
Mita, S., et al., Fabrication of a GaN lateral polarity junction by metalorganic chemical vapor deposition, Journal of Crystal Growth 311 (2009) 3044-3048.
Kuzmenko, P.J., Fabrication and testing of diamond-machined gratings in ZnSe, GaP, and bismuth germanate for the near infrared and visible, SPIE Advanced Optical and Mechanical Technologies in Telescopes and Instrumentation Marseille, France, Jun. 23, 2008 through Jun. 28, 2008.
Tassev, V., et al., Epitaxial growth of quasi-phase matched GaP for nonlinear applications: Systematic process improvements, Journal of Crystal Growth 352 (2012) 72-77.
Gordon, L., et al., Diffusion-bonded stacked GaAs for quasi-phase-matched second-harmonic generation of a carbon dioxide laser, Electronics Letters, Oct. 28, 1993, vol. 29, No. 22.
Singh, N.B., Characteristics of thick ZnSe films on quasi-phase-matched (QPM) GaAs substrates, Journal of Crystal Growth 312 (2010) 1142-1145.
Tsuchiya, H., et al., Comparison of Hydride Vapor Phase Epitaxy of GaN Layers on Cubic GaN /(IOO)GaAs and Hexagonal GaN /(III)GaAs Substrates, Jpn. J. Appl. Phys. vol. 33 (1994) pp. 6448-6453, Part 1, No. 12A, Dec. 1994.
Kuech group: Advanced Materials, processing and Synthesis: Heteroepitaxy of large lattice mismatch compound semiconductors, Website: http://amps.che.wisc.edu/research_latticemismatch.php (seen on Aug. 21, 2018).
Paduano, Q.S., et al., Effect of initial process conditions on the structural properties of AlN films, Journal of Crystal Growth 261 (2004) 259-265.
Properties of Atoms, Radicals, and Bonds, T. L. Cottrell, The Strengths of Chemical Bonds, 2d ed., Butterworth, London, 1958.
Namikawa, Y., ZnSe Single Crystals Grown by Vapor Growth Methods and Their Applications, SEI Technical Review • No. 72 • Apr. 2011, pp. 25-33.
Zachariah, M.R., Theoretical Calculation of Thermochemistry for Molecules in the Si—P—H System, J. Phys. Chem. A 1997, 101, 913-918.
Ru, Q., et al., Optical Parametric Oscillator in a random Polycrystalline Medium, Optica vol. 4/ No. 6 (2017) 617-618.
Stutzman, M. et al., Playing With Polarity, phys. stat. sol. (b) 228, No. 2, 505-512 (2001).

* cited by examiner

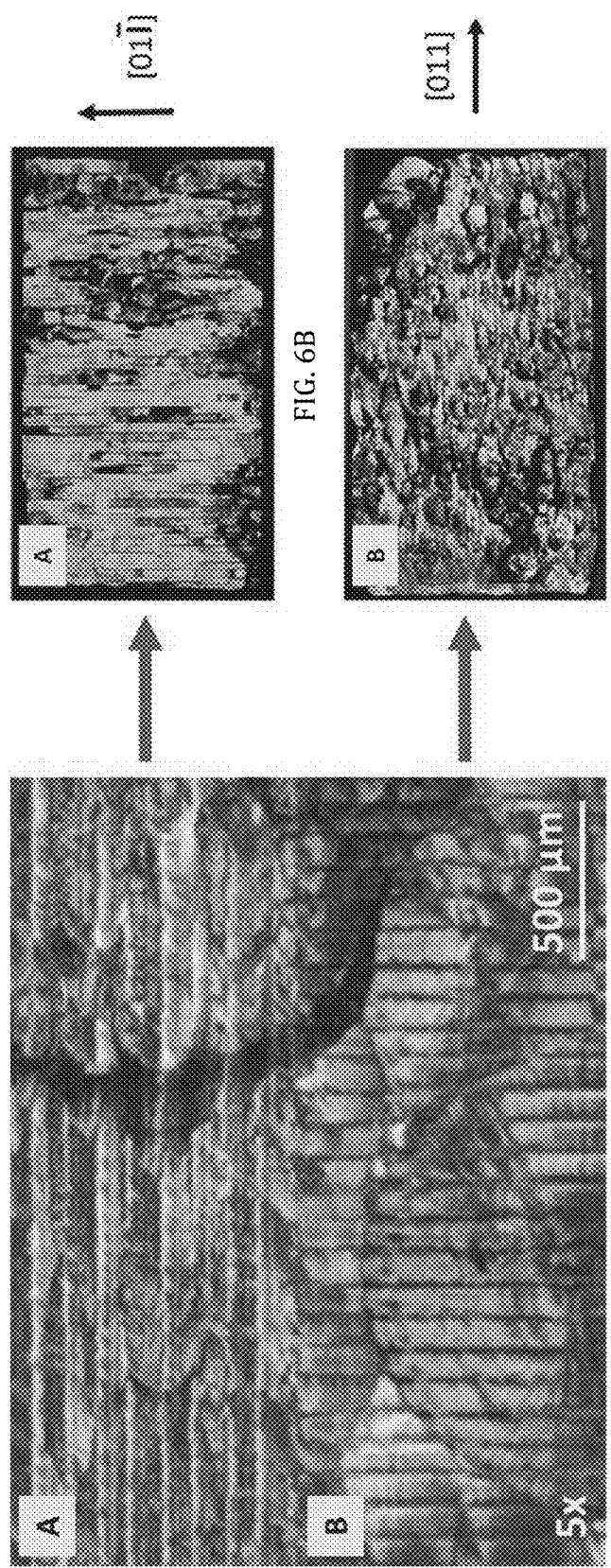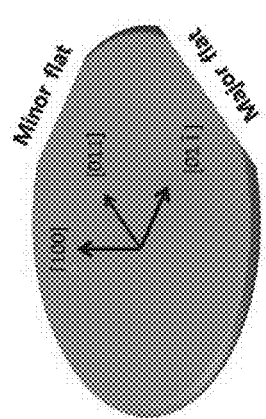
FIG. 6A  FIG. 6B  FIG. 6C  FIG. 6D

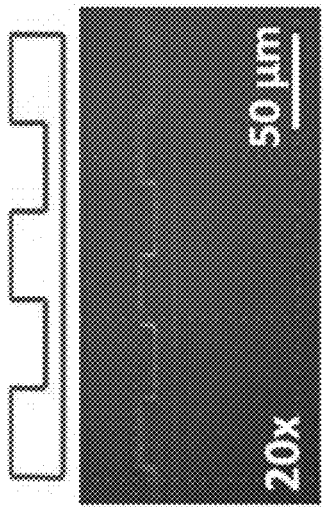
FIG. 10A – The upper layer was not etched deeply enough
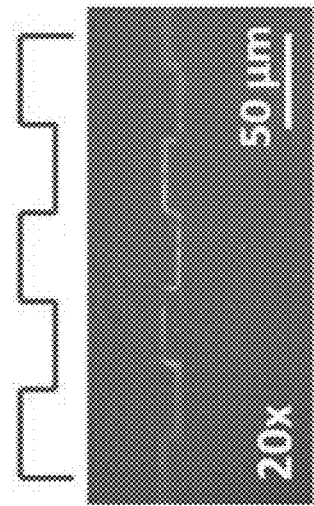
FIG. 10B – The upper layer was polished completely away

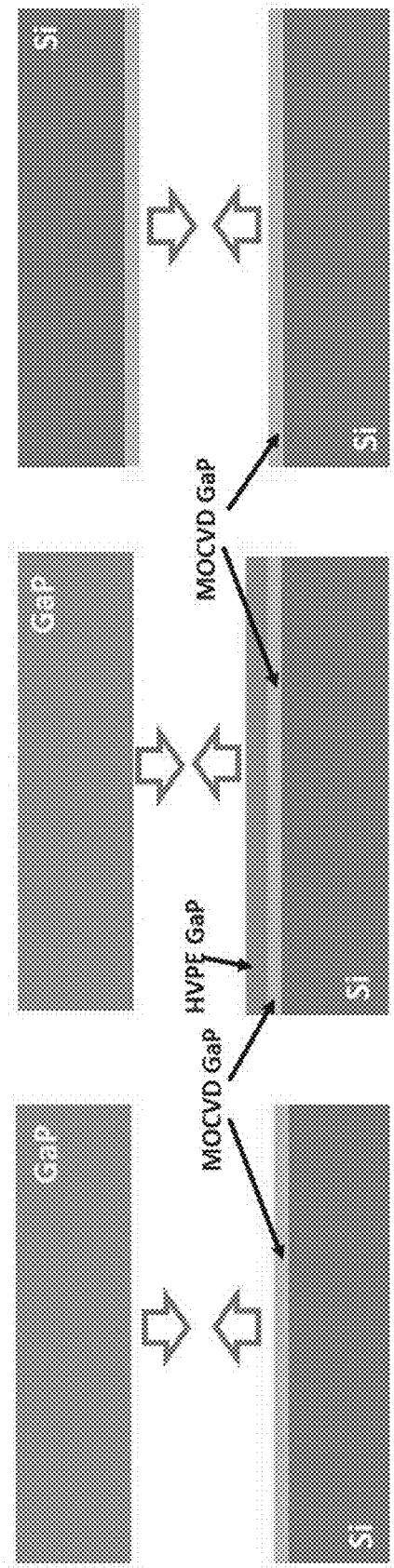

FIG. 18A Wafer bonding (fusion) technique
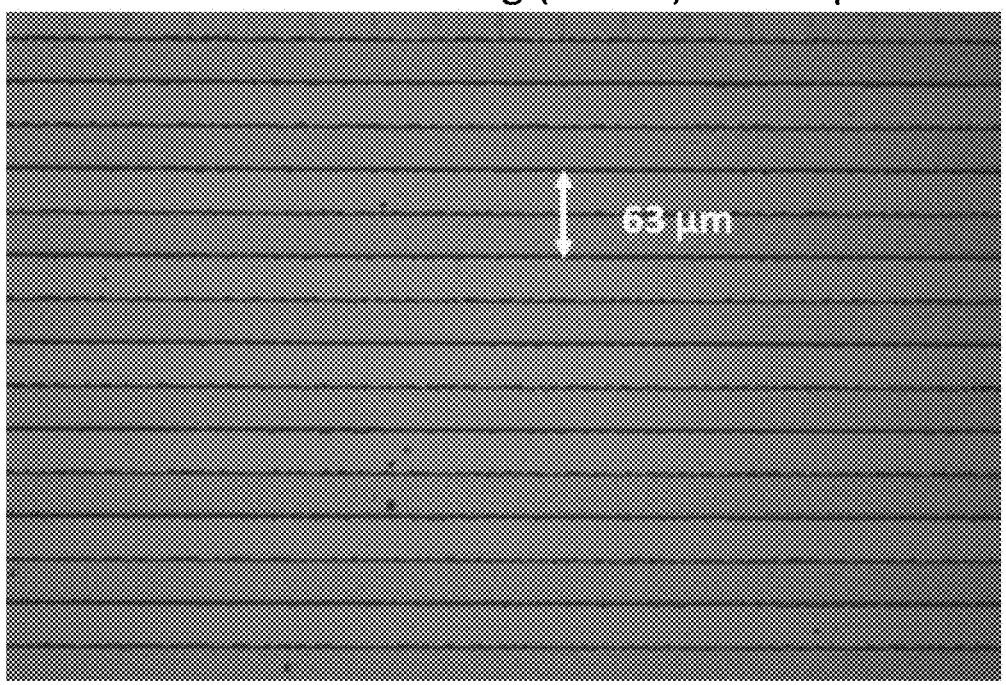
Period = 63 μm
FIG. 18B MBE assisted polarity inversion technique
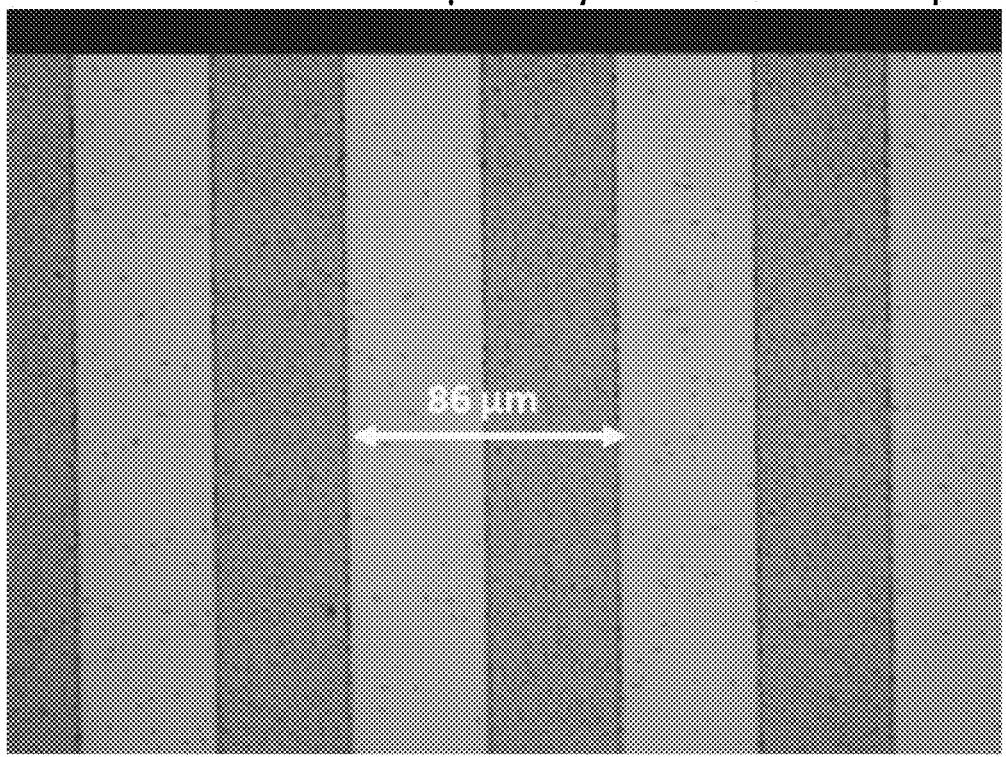
Period = 86 μm

FIG. 19

| No | heteroepitaxy | mismatch | precursor gas | ternary-forming gas | chemistry |
|---|---|---|---|---|---|
| 1 | GaP/GaAs | -3.574 % | HCl | $PH_3$ | $2Ga + 6HCl \rightarrow 2GaCl_3 + 3H_2 \rightarrow GaCl_3 + PH_3 \rightarrow GaP + 3HCl$ |
| 2 | GaP/a-GaSe | +0.807 % | HCl | $PH_3$ | $2Ga + 6HCl \rightarrow 2GaCl_3 + 3H_2 \rightarrow GaCl_3 + PH_3 \rightarrow GaP + 3HCl$ |
| 3 | InP/CdS | +0.624 % | HCl | $PH_3$ | $2In + 6HCl \rightarrow 2InCl_3 + 3H_2 \rightarrow InCl_3 + PH_3 \rightarrow InP + 3HCl$ |
| 4 | GaAs/GaP | +3.574 % | HCl | $AsH_3$ | $2Ga + 6HCl \rightarrow 2GaCl_3 + 3H_2 \rightarrow GaCl_3 + AsH_3 \rightarrow GaAs + 3HCl$ |
| 5 | AlAs/GaAs | +0.127 % | HCl | $AsH_3$ | $2Al + 6HCl \rightarrow 2AlCl_3 + 3H_2 \rightarrow AlCl_3 + AsH_3 \rightarrow AlAs + 3HCl$ |
| 6 | InAs/GaSb | -0.615 % | HCl | $AsH_3$ | $2In + 6HCl \rightarrow 2InCl_3 + 3H_2 \rightarrow InCl_3 + AsH_3 \rightarrow InAs + 3HCl$ |
| 7 | ZnSe/GaAs | 0.238 % | HCl | $H_2Se$ | $Zn + 2HCl \rightarrow ZnCl_2 + H_2 \rightarrow ZnCl_2 + H_2Se \rightarrow ZnSe + 2HCl$ |
| 8 | CdSe/InAs | -0.139 % | HCl | $H_2Se$ | $Cd + 2HCl \rightarrow CdCl_2 + H_2 \rightarrow CdCl_2 + H_2Se \rightarrow CdSe + 2HCl$ |
| 9 | α-GaSe/GaP | -0.807 % | HCl | $H_2Se$ | $2Ga + 6HCl \rightarrow 2GaCl_3 + 3H_2 \rightarrow 2GaCl_3 + 2H_2Se \rightarrow 2GaSe + 4HCl + Cl_2$ |
| 10 | α-GaSe/GaAs | -4.181 % | HCl | $H_2Se$ | $2Ga + 6HCl \rightarrow 2GaCl_3 + 3H_2 \rightarrow 2GaCl_3 + 2H_2Se \rightarrow 2GaSe + 4HCl + Cl_2$ |
| 11 | β-GaSe/GaN | +17.74 % | HCl | $H_2Se$ | $2Ga + 6HCl \rightarrow 2GaCl_3 + 3H_2 \rightarrow 2GaCl_3 + 2H_2Se \rightarrow 2GaSe + 4HCl + Cl_2$ |
| 12 | InSe – layered | | HCl | $H_2Se$ | $2In + 6HCl \rightarrow 2InCl_3 + 3H_2 \rightarrow 2InCl_3 + 2H_2Se \rightarrow 2InSe + 4HCl + Cl_2$ |
| 13 | CdTe/InSb | +0.040 % | HCl | $H_2Te$ | $Cd + 2HCl \rightarrow CdCl_2 + H_2 \rightarrow CdCl_2 + H_2Te \rightarrow CdTe + 2HCl$ |
| 14 | GaTe/InP | -0.130 % | HCl | $H_2Te$ | $2Ga + 6HCl \rightarrow 2GaCl_3 + 3H_2 \rightarrow 2GaCl_3 + 2H_2Te \rightarrow 2GaTe + 4HCl + Cl_2$ |
| 15 | HgTe/CdTe | -0.447 % | HCl | $H_2Te$ | $2Hg + 6HCl \rightarrow 2HgCl_3 + 3H_2 \rightarrow 2HgCl_3 + 2H_2Te \rightarrow 2HgTe + 4HCl + Cl_2$ |
| 16 | HgTe/InSb | -0.407 % | HCl | $H_2Te$ | $2Hg + 6HCl \rightarrow 2HgCl_3 + 3H_2 \rightarrow 2HgCl_3 + 2H_2Te \rightarrow 2HgTe + 4HCl + Cl_2$ |
| 17 | ZnTe/GaSb | +0.083 % | HCl | $H_2Te$ | $Zn + 2HCl \rightarrow ZnCl_2 + H_2 \rightarrow ZnCl_2 + H_2Te \rightarrow ZnTe + 2HCl$ |
| 18 | AlSb/GaSb | -0.650 % | HCl | $SbH_3$ | $2Al + 6HCl \rightarrow 2AlCl_3 + 3H_2 \rightarrow AlCl_3 + SbH_3 \rightarrow AlSb + 3HCl$ |
| 19 | InSb/CdTe | -0.040 % | HCl | $SbH_3$ | $2In + 6HCl \rightarrow 2InCl_3 + 3H_2 \rightarrow InCl_3 + SbH_3 \rightarrow InSb + 3HCl$ |
| 20 | GaSb/InAs | +0.620 % | HCl | $SbH_3$ | $2Ga + 6HCl \rightarrow 2GaCl_3 + 3H_2 \rightarrow GaCl_3 + SbH_3 \rightarrow GaSb + 3HCl$ |
| 21 | AlSb/InAs | -1.273 % | HCl | $SbH_3$ | $2Al + 6HCl \rightarrow 2AlCl_3 + 3H_2 \rightarrow AlCl_3 + SbH_3 \rightarrow AlSb + 3HCl$ |
| 22 | CdS/InP | -0.624 % | HCl | $H_2S$ | $Cd + 2HCl \rightarrow CdCl_2 + H_2 \rightarrow CdCl_2 + H_2S \rightarrow CdS + 2HCl$ |
| 23 | GaN/β-GaSe | -17.74 % | HCl | $NH_3$ | $2Ga + 6HCl \rightarrow 2GaCl_3 + 3H_2 \rightarrow GaCl_3 + NH_3 \rightarrow GaN + 3HCl$ |
| 24 | AlN/β-GaSe | -17.13 % | HCl | $NH_3$ | $2Al + 6HCl \rightarrow 2AlCl_3 + 3H_2 \rightarrow AlCl_3 + NH_3 \rightarrow AlN + 3HCl$ |

METHOD FOR FABRICATION OF ORIENTATION-PATTERNED TEMPLATES ON COMMON SUBSTRATES

Pursuant to 37 C.F.R. § 1.78(a)(4), this application claims the benefit of and priority to prior filed Provisional Application Ser. No. 62/692,930, filed 2 Jul. 2018, and NonProvisional application Ser. No. 16/447,677, filed 20 Jun. 2019, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to orientation-patterned (OP) templates and, more particularly, to the preparation of orientation-patterned templates on the most common, accessible, and high-quality materials available.

BACKGROUND OF THE INVENTION

Heteroepitaxy is always the first choice when there are not large-area native substrates available, but even when native substrates are readily available, crystalline growth of one material on a different crystalline material could be still preferable. Common substrates are preferred as substrates for heteroepitaxial growth of a variety of materials, including some optical and electronic semiconductor materials, due to their low cost and relatively high quality, which makes them the perfect substrates for a variety of applications. A "common" substrate is a crystalline substrate (e.g., Si, Ge, $Al_2O_3$, GaAs, InAs, GaP, InP, GaSb, AlN, GaN, ZnSe, ZnTe, GaSe . . . ) made from raw materials that are cheap, and widely naturally available. Common materials should be able to be grown with high quality in mature growth processes using common growth techniques such as Czochralski (CZ), Bridgeman, Edge-defined Film-fed Growth (EFG), solution growth, incl. solvothermal growth, etc. which are already adopted by the industry. Such processes should be able to be performed at relatively standard growth conditions rather than at non-standard, i.e. extreme growth conditions, e.g. excessively-high temperatures or pressures, and such processes will avoid, when possible, the usage of poisonous, flammable, or corrosive (i.e. environmental unfriendly) chemicals. The substrate preparation techniques for these common materials, such as cutting the grown crystal boule into substrates and polishing these substrates, should also be well-developed and affordable, and less time- and effort-consuming, while allowing simultaneous machining of multiple wafers. Each of these factors has a role in forming the final cost of the substrate. Some examples of common substrate materials are presented in Table. 1. Some common substrates adopted by the industry.

The prices shown in Table 1 are for undoped (often called unintentionally doped) material with the most common crystallographic orientations, such as [100] or [001], which in many cases coincide with the direction of the subsequent epitaxial growth on them. Accordingly, doped substrates or substrates with more exotic orientations, e.g. (111), will be more expensive. Note: [111] means the crystallographic direction, which is perpendicular to the crystallographic plane (111). At the same time looking at Table 1 one should have in mind that a 2-inch wafer of a certain material could be more expensive, for example, than a 6-inch substrate of the same material if the technology to manufacture this particular material has already moved the standard toward the larger sizes. In addition, some substrate materials like GaN or AlN are more affordable only if a thin GaN or AlN layer is deposited on a more common substrate such as, for example, sapphire ($Al_2O_3$) or Si. As for some other materials, such as ZnSe, ZnTe, or GaSe, although there are bulk growth techniques available, such as, for example, Physical Vapor Transport (PVT), they still can be purchased mostly as polycrystalline substrates. In such cases materials like those might be considered as "less common" substrates. All this limits the number of their applications, such that the only chance to grow them as single-crystal films large enough for device development is to grow them heteroepitaxially. In such cases, however, it is critically important that the foreign substrate has a close lattice and thermal match to the growing layer. Examples of such substrates are GaAs for ZnSe growth, GaSb for the growth of ZnTe, and GaP or GaAs for the growth of gallium selenide (its cubic α-phase ($Ga_4Se_6$), or GaN for the growth of its hexagonal β-phase (GaSe). Strictly speaking, the definition for "common" is quite flexible. It is more important to identify what can make the growth of a particular material possible. In addition, with the advance of semiconductor growth technology it is simply a question of time and interest for a particular material to become a more "common" substrate.

Note: In contrast to the well-studied hexagonal β-phase GaSe, there is a large discrepancy in the literature about cubic α-phase gallium selenide, called in some works $Ga_2Se_3$. The same formula, however, is used by others for the monoclinic GaSe. The material composition suggested herein is based on our own high-resolution XRD study using the available data base.

Si is the cheapest and the most widely used semiconductor substrate, and it has the highest possible material quality. Si can be grown conveniently from melt in the shape of large boules (up to 450 mm in diameter) or plates in mature processes such as CZ and EFG. However, what really makes Si an attractive substrate for heteroepitaxy is its relatively high electrical and thermal conductivity and the possibility of combining it with some traditional optical materials, e.g. GaAs and GaP and their ternaries and quaternaries. Accord-

TABLE 1 below along with their average prices at the time of this writing.

| Substrate | Si | $Al_2O_3$ | Ge | GaAs | InP | GaSb | InAs | GaP | SiC | CdS |
|---|---|---|---|---|---|---|---|---|---|---|
| Price* | <30 | 40-50 | 150-170 | 80-90 | 400-450 | 500-550 | 550-600 | 600-700 | 900-1000 | 1500-1600 |

*The average price is in USD for 2-inch undoped wafers with the most frequently used orientations.

ingly, a number of electronic and optical materials (including GaAs and GaP) have been attempted to grow with more or less success on Si substrates using a variety of different growth techniques. Among these are some common industrial techniques such as MBE and MOCVD, as well as some other less typical approaches such as Remote Plasma-Enhanced Chemical Vapor Deposition (RPE-CVD) or Liquid Phase Epitaxy (LPE).

The opposite case of the growth of Si on other suitable materials, such as GaAs and GaP, has also been investigated. Growths were performed either directly on the substrate or after the deposition of an intermediate buffer layer, as the purpose of the buffer layer being to accommodate the desired growing layer to the foreign substrate. There have also been attempts to grow other semiconductor materials on patterned Si-substrates, especially when the lattice mismatch between the growing material and the Si-substrate is large. In such cases a pattern, e.g. in the shape of rows of dots, is used to provoke a more uniform distribution of the nucleation on the substrate surface and to facilitate the release of the elastic strain built during the initial stage of growth as a result of the lattice and thermal mismatches between the substrate and the growing layer. In all these cases the fast oxidation of Si is an obstacle, as well as how important the surface preparation or its pre-growth treatment are. However, due to the complex chemistry and growth mechanisms at the growing interface, and especially due to the significant differences in the thermal conductivity and thermal expansion coefficients between Si and most of the compound semiconductor materials, thick growth techniques, e.g. Hydride Vapor Phase Epitaxy (HVPE), with some exceptions were avoided, even when the two materials had a close lattice match. Instead of thick growths, bonding of another thick material with the Si underlying wafer has been applied with differing success for several different material systems.

There are at least four major factors that should be taken into account when one is making the choice to heteroepitaxially grow one material on a foreign, non-native substrate, including common substrates: (i) the lattice mismatch, i.e. the relative difference between the lattice constants of the substrate and the growing material. This plays an important role even during thin layer growth attempts; (ii) the thermal mismatch, which includes both the difference in the thermal expansion coefficients and the difference in the thermal conductivities—the role of this factor increases with increasing thickness of the growing layer; (iii) the nature of the growth technique itself—some growth techniques such are MOCVD or MBE are more suitable for thin layer growth, whereas others, such as HVPE or PVT, are more suitable for thick layer growth; and (iv) the surface quality of the substrate material;

Following are some examples that show how complex it is to make good choices for heteroepitaxy:
1) The small lattice mismatch between GaP and Si (+0.44%) (See Table 2 below and FIG. 1B) was not helpful when trying to grow GaP directly on a Si-substrate by HVPE. In this case the growth resulted in only a few small (several microns in size) randomly distributed GaP crystallites on the Si substrate surface but not in a continuous layer (see FIGS. 1A and 13A). However, using MOCVD to perform the same GaP/Si growth resulted in about 250 nm thin high quality GaP layer on the same Si substrate. Shall we in this case attribute the lack of success to the relatively large difference in the thermal expansion coefficients of GaP and Si (equal to 2.2) (see Table 2, column 4)? Probably not, because the influence of this factor is getting stronger as the layer thickness increases, while in this case we do not have a layer at all. However, the different natures of HVPE and MOCVD techniques may play a more important role. For example, the high quality of the Si substrate, expressed by the low etch pits density (EPD), does not give much chance for a close-to-equilibrium growth process (HVPE) to initiate a massive nucleation of GaP (and thus a growth of a continuous GaP layer), which is not a problem when using a far-from-equilibrium process such as MOCVD or MBE.
2) High-quality thick growth (e.g. GaP/GaAs) can be achieved by HVPE even at relatively large lattice mismatch between, for example, GaP and GaAs (−3.57%) (see FIG. 1B). In this case the small difference in the thermal expansion coefficients (equal to 0.6) (see Table 2, column 4) should be the "supportive" factor, in spite of the twice larger thermal conductivity of GaP (see Table 2 column 2).
3) Another thick growth technique (PVT) for growth of ZnSe/GaAs (lattice mismatch of only +0.24%) (see FIG. 1B) led to results which were not very impressive (see FIG. 1C). PVT expressed poor domain fidelity during the growth of OPZnSe on OPGaAs templates—of course, the large difference in the thermal conductivities of GaAs and ZnSe (see Table 2, column 2) shall also have some negative impact. On the other hand, PVT, by providing fewer options for control of the growth chemistry than HVPE, seems to be more suitable for bulk growth than for layer growth. In spite of that, large-area crystalline ZnSe is not readily available on the market. The samples that vendors claim as "crystalline" ZnSe are typically 5 mm×5 mm and even then one can recognize in one small commercial sample several grains with different crystallographic orientations. The situation with other materials such as ZnTe, GaSe and many others is about the same which further increases the value of the approach proposed here. The interest in these materials for nonlinear optical applications is so strong that frequency conversion (through random phase matching) attempts have been made using even polycrystalline material, where the efficiency is much lower than the efficiency in crystalline materials.

TABLE. 2

A comparison of thermal and lattice parameters of some plain with some III-V and II-VI semiconductor materials.

| Material | Thermal conductivity [W · m−1 K$^{-1}$] | Thermal expansion coefficient [$10^{-6}$ C$^{-1}$] | Differences in thermal expansion coefficient | Lattice constant [Å] | Lattice mismatch [%] |
|---|---|---|---|---|---|
| GaP | 110 | 4.8 | GaP − GaAs = −0.6 | 5.4505 | GaP/GaAs = −3.57 |
|  |  |  | GaP − Si = 2.2 |  | GaP/Si = +0.44 |
| Si | 130 | 2.6 | Si − Ge = −3.5 | 5.4310 | Si/Ge = −4.01 |
| GaAs | 55 | 5.4 | GaAs − Ge = −0.5 | 5.6530 | GaAs/Ge = −0.09 |

TABLE. 2-continued

A comparison of thermal and lattice parameters of some plain with some III-V and II-VI semiconductor materials.

| Material | Thermal conductivity [W · m−1 K⁻¹] | Thermal expansion coefficient [10⁻⁶C⁻¹] | Differences in thermal expansion coefficient | Lattice constant [Å] | Lattice mismatch [%] |
| --- | --- | --- | --- | --- | --- |
| Ge | 58 | 5.9 | Ge − Si = 3.5 | 5.6580 | Ge/Si = +4.01 |
| ZnSe | 18 | 7.1 | ZnSe − GaAs = 1.7 | 5.6680 | ZnSe/GaAs = +0.24 |
|  |  |  | ZnSe − Ge = 1.2 |  | ZnSe/Ge = +0.18 |
| GaSb | 32 | 7.7 | ZnTe − GaSb = 0.5 | 6.0959 | ZnTe/GaSb = +0.08 |
| ZnTe | 11 | 8.2 | ZnTe − GaSb = 0.5 | 6.1010 | ZnTe/GaSb = +0.08 |

All these confusing results tell us that the proposed approach for thick heteroepitaxial growth and for the preparation of OP templates using common substrates is not obvious, even for an experienced grower; it is not a combination of well-known elements. The surprising or controversial results below show that, although that the lattice and thermal matches between the growing layer (film) and the substrate may be the most important factors, many others must be also taken into account in each particular heteroepitaxial case. In all these clever attempts to combine materials, not only different materials but also different growth and template preparation approaches might also be very helpful in solving the present technological issues.

Note: Herein, for more clarity we will call an unpatterned sample a "substrate", while a "template" is any patterned, e.g. orientation-patterned, sample.

Focusing on the successful thick HVPE growth of GaP/GaAs (as an example), it is believed that during the pre-heating stage or/and during the initial stages of the HVPE growth, the non-native precursor (phosphine ($PH_3$) is "non-native" because neither P nor H are elemental components of the GaAs substrate) "damages" the surface of the GaAs substrate, etching and roughening it. This roughening is not necessarily a bad thing, because it creates more nucleation points, saturating at the same time the GaAs substrate surface with phosphorus (P) atoms, which eventually partly replace the arsenic (As) atoms in the GaAs structure. This is possible because the bonding energies of the Ga—As bond is weaker (209 kJ/mol) than the bonding energy of the Ga—P bonds (230 kJ/mol). This condition (the non-native precursor) is thought to initiate the deposition of a transition GaAsP (ternary) buffer layer. Applying a similar approach to growing GaP on Si, however, may not be successful because the bonding energy for the Si—Si bond is stronger (327 kJ/mol) than the bonding energy for the Si—P bond (300 kJ/mol). In such a case even the similarity between the two, diamond (Si) and the zinc-blende (GaP) structure and the much smaller (one order of magnitude smaller) lattice mismatch between GaP and Si is not enough to support a thick GaP/Si growth. The larger difference in their thermal expansion coefficients (see Table 2, column 4) should be an additional obstacle when one is attempting to grow thick GaP on Si.

In summary, to this point we have several examples of heteroepitaxy which are difficult to explain:
(i) GaP does not grow on Si by HVPE in spite of the close lattice match between GaP and Si, but it grows perfectly by MOCVD;
(ii) By using the same technique (HVPE) one can successfully grow thick high quality GaP on either plain GaAs substrates or OPGaAs templates in spite of the large lattice mismatch between GaP and GaAs; and
(iii) Using another thick growth technique, PVT, resulted in relatively poor quality OPZnSe grown on OPGaAs templates in spite of almost perfect lattice match between ZnSe and GaAs.

Most of these examples are limited to growth on plain substrates on some of the materials shown in Table 2.

Current Limitations and Disadvantages Related to the Fabrication and Growth on OP Templates There are a number of problems with the fabrication of OP templates and subsequent thick growth on them. At the present there are only a few nonlinear optical materials which are able to be fabricated as OP templates and which are capable of supporting growth thereon. Such non-linear optical materials include GaAs, GaP, and GaN.

There are two major approaches for the preparation of OP GaAs and GaP templates: (1) MBE assisted polarity inversion, and (2) a wafer fusion or wafer bonding technique. The preparation of an OPGaN template is favored by more options, due to the more mature polarity control established in the growth of III—Nitrides.

Each of these two techniques for OP template preparation suffers from its own shortcomings. For example, the MBE assisted polarity inversion requires an expensive MBE tool equipped, in addition, with a source of Ge (in case of OPGaAs template preparation) or Si (in case of OPGaP template preparation). During the process of template preparation a several monolayer thin sub-lattice of a non-polar material (Si or Ge) is deposited by MBE on the polar substrate material (GaP or GaAs). Due to the close values of their ionic radii (see FIG. 2A) and similar properties (see Table 2 above), Ge is used in case of GaAs and Si in case of GaP (see FIG. 2B).

The role of the non-polar material is to minimize the polar nature of the subsequent layers of the polar material, in other words to "wash off" the polarity of the polar material. Thus, after the Si or Ge deposition the initial polar material has no influence over the subsequent polarity. After that, the material can grow either with one or the other polarity on different spots of the single crystal surface. In contrast, in the case of GaN it is well-known which growth conditions will result in one or the opposite polarity. However, small islands with the opposite polarity that may pierce the whole layer thickness have been detected here and there within a large area with one and the same polarity. In the case of GaAs and GaP, it is much harder to control the crystal polarity by the choice of proper growth conditions, although that in theory some of them should be more suitable for one than the opposite polarity. Through experimentation it was determined that the polarity of GaAs, for example, can be inverted if the GaAs substrate is not precisely an "on-axis" (100) substrate but with a 4° miscut exactly towards (111)B. In addition, the growth on this miscut substrate must be conducted in a very narrow, practically determined, temperature range. In general, there is a great deal of uncertainty that can easily disrupt the polarity inversion of GaAs or GaP by the MBE polarity inversion technique.

The crystallographic polarity of the grown material can, as a practical matter, be recognized only by the presence on the top layer surface of some specific features that are more inherent to the one or the other polarity before or after etching the surface, or by the different etching rates associated with the two opposite polarities. As already mentioned, in contrast to other materials, e.g. GaN, where much work has been done on polarity control, the polarity control of GaAs, GaP, ZnSe, ZnTe, GaSe and some other less-studied nonlinear optical materials is less certain. In addition, in contrast with III-Nitride OP templates, where there are several easier techniques for their preparation, parties interested in template preparation of OPGaAs and other related materials have had only one additional choice—the already mentioned wafer fusion (wafer bonding) approach.

The wafer fusion technique, however, has its own limitations which become even more complicated during the fabrication of OPGaP templates. First of all, with this approach one cannot bond miscut wafers, but only "on-axis" wafers—bonding two tilted surfaces against each other results in too much interruption of the crystal structure. Thus, from the very beginning one can see that there are at least two serious disadvantages of using "on-axis" templates—the slower growth rate and the rougher surface layer morphology—both associated, in particular, with "on-axis" growth.

In more detail, while a miscut wafer provides plenty of sites on the atomic terraces for the atoms approaching the surface to adhere, the growth on an "on-axis" surface relies mostly on surface defects such as end of screw dislocations. That is why the growth on "tilted", i.e. miscut surfaces is about 30-40% faster. At the same time, such growth results in a smoother surface morphology (see FIG. 3A), whereas the growth on "on-axis" substrates typically results in a rough surface covered with numerous randomly distributed hillocks with different widths and heights (see FIG. 3B).

Things get even more complex when the growth is performed on GaP where the etch pit density (EPD) of the commercially available material is between $(8-10) \times 10^4$ cm$^{-2}$, as compared with the typical EPD of GaAs which is $(2-5) \times 10^3$ cm$^{-2}$ or of the almost perfect Si, where the EPD is under 100 cm$^{-2}$ (see Table 3). One can get a good impression about how the EPD of the initial substrate surface influences the density of the hillocks observed after growth by looking at the top surfaces of homoepitaxially grown GaP on "on-axis" (100) GaP (see FIG. 4A) and heteroepitaxially grown GaP on "on-axis" (100) GaAs, with a significantly lower EPD (see FIG. 4B). FIG. 4B is a top surface image of GaP grown on "on-axis" (100). GaAs behaves similarly, but the hillock growth is less pronounced due to the smaller EPD on the GaAs surface. As a consequence, because only "on-axis" wafers can be bonded, the fused OPGaAs templates by default must provide a better start (a surface with fewer etch pits) for subsequent thick HVPE growth, in contrast with the fused OPGaP templates, due to the poorer initial surface quality of the GaP wafers used in the bonding.

The intensive hillock growth, however, is not the biggest disadvantage of the fused OPGaP templates, and it is solvable, to some degree. The oppositely oriented domains can propagate throughout the hillocks, reaching their top surfaces as in the cases of even smaller domain widths when several domains "share" one hillock, as it is shown in FIGS. 5 and 6A-6C.

FIG. 5 depicts a Nomarski optical microscopic image with the top surface of OPGaP grown homoepitaxially on an "on-axis" (100) OPGaP templates; only areas with domains oriented along the [011] direction, i.e. perpendicular to the minor flat, are shown in this image. However, in general, both oppositely-oriented domains propagate to the top, "sharing" some of the larger hillocks (if the domain width is smaller than the width of the related hillock).

On the particular sample from FIG. 6A, the pattern was deposited in two mutually perpendicular crystallographic directions—with domains along [01$\bar{1}$] (FIG. 6B—i.e. perpendicular to the major wafer flat, as depicted in FIG. 6D) and along [011] (FIG. 6C—i.e. perpendicular to the minor wafer flat, also as depicted in FIG. 6D). As can be seen, the hillock growth is less pronounced when the domains of the pattern are oriented along [01$\bar{1}$] (FIG. 6B), and more pronounced when the growth is performed on the domains oriented along [011] (FIG. 6C). This is because the previously mentioned atomic terraces are in the case of [01$\bar{1}$] more favorably oriented towards the direction of growth than in the [011] case.

Another, more serious, problem related to the preparation of wafer fusion bonded OPGaP templates is the bad parallelism of the commercially available GaP wafers. Bonding such wafers leaves voids (see FIG. 7A) between them that could occupy large portions of the bonded surface making it useless for domain inversion applications. In contrast, this is easily avoided when bonding two GaAs wafers due to their better parallelism (see FIG. 7B).

To avoid this problem, the GaP wafer parallelism may be improved before bonding by the so-called "fly-cut" technique. This additional procedure, however, not only makes the template preparation procedure more expensive and complex, but also leaves about 20 nm deep parallel technological grooves (with about 1 μm periodicity) on the wafers' surface that must be polished off to increase the area of contact between the two wafers prior to bonding. (see FIG. 8).

There is another reason to give up the wafer bonding technique for GaP wafers: to date there is no known effective "etch-stop" material for GaP, while at least two etch-stop materials, AlGaAs and InGaAs, can be used in the GaAs wafer bonding process. In more detail, during the first step of preparation of the OP templates, in the case of GaAs, a thin "etch-stop" layer is deposited on one of the two GaAs pieces (see FIG. 9).

After the etch stop layer is applied, a thin GaAs layer with the inverted orientation is deposited on the "etch-stop" layer and this (upper) GaAs piece is turned upside down and bonded to the lower piece at high temperature (step 1). Next, most of the GaAs material, which is above the "etch-stop", is polished-off. If there is still some residual GaAs left after the polishing, it is then etched by a chemical (etchant) that does not damage the "etch-stop" material. After that the "etch-stop" layer is etched by another chemical (etchant) that does not etch GaAs (see step 2 of FIG. 9). Thus the thin inverted layer is protected. This, namely, is the major role of the etch-stop—to secure the thickness of the inverted layer.

Next, the template is covered with photoresist and patterned (step 3). Next, the inverted layer is etched through the openings in the pattern until access to the lower GaAs piece with the first polarity is achieved (step 4). The last step of this procedure is to remove the residual photoresist from the top of the template.

The preparation of the OPGaP templates is identical (see FIG. 9, bottom row) to that described above with the exception that, as it was already mentioned, to date no etch-stop material has been discovered for the case of GaP.

Accordingly, the thickness of the inverted GaP layer, which should not be more than several microns (the thinner the better), depends entirely on the precision of the polishing equipment and the experience of the polisher.

FIGS. 10A-10B depict schematic (at left) and Nomarski microscopic cross sectional images (at right) showing some common mistakes during the preparation of OPGaP templates due to the absence of etch-stop material that lead to having access to only one of the crystallographic orientations. In FIG. 10A, for example, the upper layer was not etched deeply enough, and in FIG. 10B the upper layer was completely polished-off even before proceeding with the subsequent steps of patterning and etching.

Due to bad parallelism, precise alignment of the sample before polishing is difficult. Thus the polishing process may result in a tilted surface such that the inverted layer has a gradually-reducing thickness along the template's length (see FIG. 11).

What is needed is a method for fabricating OP (orientation-patterned) templates that overcomes each of the aforementioned shortcomings, i.e. the higher etch-pit density of GaP that results in much more intensive hillock growth, e.g. rougher surface morphology, the absence of an etch-stop material, which means an uncertainty in the inverted layer thickness and, a real probability for the HVPE growth to fail for not having access to the two crystallographic orientations, as well as the time- and effort-consuming polishing process, which are all good enough reasons to suspend the preparation of OPGaP templates by wafer fusion bonding.

SUMMARY OF THE INVENTION

The present invention overcomes the foregoing problems and other shortcomings, drawbacks, and challenges of heteroepitaxy. While the invention will be described in connection with certain embodiments, it will be understood that the invention is not limited to these embodiments. To the contrary, this invention includes all alternatives, modifications, and equivalents as may be included within the spirit and scope of the present invention.

This invention is a technique for the preparation of orientation-patterned (OP) templates on the most common, accessible, cheap, and high quality materials, e.g. Si, or Ge. If the template material that will be bonded during the fabrication process to the common substrate is a nonlinear optical material with a large second order nonlinear susceptibility $\chi^{(2)}$, for example GaAs, GaP, or ZnSe, then such templates maybe used for subsequent thick growth of OP quasi-phase-matching (QPM) structures for frequency conversion devices (FCD). Such devices would allow conversion of the frequency of some conventional laser sources to radiate in frequency ranges that are either not accessible by any or accessible by only a few available direct lasers which, in addition, are either large in size, with small output power, poor tunability, and need to be cooled in order to operate efficiently. An OP template is, in general, a template with a pattern, e.g. a striped pattern that consists of numerous longitudinal parallel domains with alternating crystal polarity. The domains may be only a few microns wide. However, the inventive disclosure is not restricted to a particular shape or size of the pattern or its elements, or any requirements for polarity alternation; it could be any pattern shaped by a given mask for some sort of selective growth that is needed for a particular optical, electronic, or optoelectronic application. If the pursued application is for frequency conversion, the requirement for high second order nonlinear susceptibility suggests that this particular crystal material does not possess inversion symmetry. Otherwise the first non-zero term in the polarization equation $P_i = \Sigma_1^i \chi^{(i)} E_i$ will be $\chi^{(3)}$, i.e. quasi-phase-matching and from here frequency conversion (which are second order phenomena), will not be possible. There are not, however, such requirements for other materials with other applications that are relying on growths on masked but not OP templates. As already mentioned, the most important criterion when one makes the choice of the materials in the heteroepitaxial pair is the lattice and thermal mismatch between the base material, i.e. the substrate or the template, and the material that will grow and transfer the pattern from the OP-template throughout the whole layer thickness. In the particular case of Si, one of the most suitable partnering materials is GaP because of their close lattice match. However, the lattice mismatches between Ge and GaAs or GaAs and ZnSe are also negligible, so they could make good pairs as well. Looking at the lattice and thermal mismatches (see FIGS. 1B and 19, and Table 2), however, one can determine many other heteroepitaxial cases such as AlAs/GaAs, ZnTe/GaSb, InAs/GaSb, α-GaSe/GaP, α-GaSe/GaAs, or β-GaSe/GaN, etc. One should also bear in mind that there are many more factors related, e.g. the maturity of the particular growth processes and the template preparation techniques (if available), avoiding the use of environmentally unfriendly chemicals, and of course, other material parameters correlated to a specific practical application. Finally, the technique proposed here for the preparation of patterned templates on common substrates is based not only on the combination of two different materials, but also, when it is necessary, on the combination of two growth approaches which are different by their natures—one close-to-equilibrium (e.g. HVPE, Hydride (or Halide) Vapor Phase Epitaxy) and one far-from-equilibrium, e.g. Molecular Beam Epitaxy (MBE) or Metal Organic Chemical Vapor Deposition (MOCVD).

According to one embodiment of the present invention a method for preparation of orientation-patterned (OP) templates comprises the steps of: depositing a first layer of a first material on a common substrate by a far-from-equilibrium process; and depositing a first layer of a second material on the first layer of the first material by a close-to-equilibrium process. The inventive combination of the two dissimilar processes is useful for creating assemblies which are not able to be made by known processes in a single step. The assemblies may be useful in a wide range of electronic devices, e.g. frequency conversion devices, or components for subsequent processing.

According to a first variation of the method, the first material and the second material may be the same material or different materials. By the application of the epitaxy principles disclosed herein, homo- and hetero-epitaxy is more easily achievable than ever before.

According to another variation of the method, the common substrate material may be $Al_2O_3$ (sapphire), or plain semiconductors, such as silicon (Si) and germanium (Ge), or binary compound semiconductor materials, such as GaAs, GaP, GaSb, InAs, InP, CdTe, CdS, CdSe, GaSe, etc. In rare cases ternaries or quaternaries may also be included as substrates, although they may be considered as "less common" substrates due to their more complicated growth parameters.

According to a further variation of the method, the first material deposited on the common substrate is one or more electronic or optical binary materials, e.g. AlN, GaN, GaP, InP, GaAs, InAs, AlAs, ZnSe, GaSe, ZnTe, CdTe, HgTe, GaSb, SiC, CdS, CdSe, etc. or their ternaries or quaternaries, e.g. AlGaN, GaAsP, etc.

According to another variation of the method, the first layer of first material is a material that is different from that of the substrate material. However, in some cases the substrate and the deposited layer may be the same material, depending on the material properties desired in the intermediate or final product.

According to a further variation of the method, the first layer of the second material deposited on the first layer of the first material is of a material that is the same as the first material of the first layer but different from that of the substrate material. The inventive process allows one to intentionally grow numerous layers of various compositions atop one another. Successive homo- and/or heteroepitaxial processes may be performed to achieve the desired material configuration.

According to another variation of the method, the far-from-equilibrium process is one of MOCVD and MBE. MOCVD and MBE are very useful for depositing the first material of the first layer.

According to a further variation of the method, the close-to-equilibrium process is HVPE. HVPE is very useful for depositing the second material of the first layer.

Another variation of the method for preparation of orientation-patterned templates further comprises: determining the polarity of the second material of the first layer (top layer) of a first assembly; determining the polarity of the second assembly (if there are no layers deposited on the second assembly) or the polarity of the top layer of the first layer deposited on the second assembly (if layers have been deposited on the second assembly); and bonding the top layer of the first assembly to the second assembly (this may be the substrate or the topmost layer depending on how many (or if any) layers are deposited on the second assembly) so that the polarities of the two bonded layers are opposites, to make a bonded pair. The goal is for the bonded layers to have opposite polarities, which may not be a goal that can be achieved directly via epitaxy. The bonded materials of the bonded layers are the same but the two bonded pieces are of different polarities. One of the pieces, for example, may be a thin GaP layer deposited on a Si substrate, while the second piece may be simply a GaP substrate having the opposite polarity. The two GaP surfaces with opposite polarities are bonded together but the two assemblies are of different construction. However, in another variation two (almost) identical GaP/Si pieces may be bonded, with the only difference being that the polarities of the thin GaP layers deposited on the two Si pieces are opposites.

According to a further variation, the method may further comprise applying pressure and temperature to bond the top layer of the first assembly to the top layer of the second assembly with opposite polarities.

Another variation of the method for preparation of orientation-patterned templates may further comprise removing from the bonded pair the substrate corresponding to the first assembly to expose a bottom surface of the bonded pair. Selective etching or chemical removal of the desired layer(s), e.g. substrate layer or other layer to be removed will expose another surface of the first layer of the first material of the first assembly.

A further variation of the method for preparation of orientation-patterned templates may further comprise removing from the bonded pair the substrate corresponding to the second assembly. The goal is to remove those layers that are not necessary for inclusion in the final apparatus, e.g. frequency conversion devices, leaving behind those layers which are necessary in the final product, but which cannot be grown epitaxially, e.g. layers with opposite polarity orientation.

Another variation of the method for preparation of orientation-patterned templates may further comprise patterning the top surface of the bonded pair.

A further variation of the method for preparation of orientation-patterned templates may further comprise coating the top surface of the bonded pair with photoresist; exposing the photoresist to a desired pattern with UV light; developing the pattern; and selectively etching the pattern from the bonded pair. The resulting orientation-patterned assembly may be incorporated into a wide variety of devices, as described below.

The various steps described above and in the claims may be mixed and matched in any combination to achieve the desired epitaxial goals.

Another embodiment of the invention may be described as follows:

Step 1—Depositing a first layer of a first material on the common substrate by a far-from-equilibrium process (MOCVD or MBE). The material of the deposited layer may be the same or different than the substrate material; in the latter case the two materials should have thermal coefficients and lattice matches as close as possible, e.g. typically no more than 2-3% lattice mismatch. Then, if desired, growing a second, thicker layer from the same material deposited on the first grown/deposited layer by a close-to-equilibrium process (HVPE). The desirability of this optional step depends on whether the thin (MOCVD or MBE) layer can survive without thermal decomposition or cracking during the subsequent bonding procedure.

The far-from-equilibrium process may be one of molecular beam epitaxy (MBE) and Metal-Organic Chemical Vapor Deposition (MOCVD); MOCVD may be preferable because it is an industrially adopted process capable of multiple wafer processing.

The common substrate may be one of $Al_2O_3$ (sapphire), silicon (Si), germanium (Ge), GaAs, GaP, GaSb, InAs, InP, CdTe, CdS, GaSe, etc. The choice of the common substrate depends on the lattice and thermal mismatch with the growing material, i.e. the material grown on the substrate, their availability, and price.

The first material (corresponding to the grown material) may be one or more of AlN, GaN, GaP, InP, GaAs, InAs, AlAs, ZnSe, GaSe, ZnTe, CdTe, HgTe, GaSb, SiC, CdS, CdSe, etc., or even their ternaries or quaternaries, such as AlGaN, GaAsP, etc.

Step 2—Determining the polarity of the deposited first layer. The polarity may be recognized by the shape/orientation of some grown features or voids left after etching, or by the etching rate, which is usually different for different crystallographic orientations. Another way to recognize two opposite crystal polarities (orientations) is to expose the material to a related non-native precursor. For example, in the particular case of GaAs, if one exposes two opposite orientations of GaAs to $PH_3$, the exposure will make longitudinal etch pits on the surface, different polarities having lengths (of etch pits) that are oriented in two mutually perpendicular directions.

Step 3—Determining the polarity of a second wafer or of the layer grown (if it was grown) on the second substrate; the material of this second wafer or the layer grown on the second substrate (if it was grown) must be the same as the layer on the first substrate, but their orientations must be opposite. Determining which orientation is which is not that important. It does matter, however, to ensure that the two pieces have opposite crystallographic orientations (opposite crystal polarities).

Step 4—Bonding the two samples with opposite polarities. This step may include a number of sub-steps:

4.1. Placing the first or second layer grown on the first substrate against the substrate (if there was no grown layer) or against the first or the second layer grown on the second substrate with the precaution that the two facing pieces in the pair must have opposite crystallographic orientations (opposite polarities). If the polarities were not determined, (according the recommendations given in steps 2 and 3 above) there are at least two experimental procedures that can be followed to secure the opposite crystallographic orientations of the two pieces: 1) before bonding prepare two different sets for bonding—in the first one (set No 1) match the major flats of the two wafers and in the second one (set No 2) orient the major flats mutually perpendicular, i.e. match a major with a minor flat (this takes advantage of the fact that in many zinc-blende materials crystallographic polarity switches to the opposite one at 90 degree rotation around [001] orientation—see FIG. 15); or 2) before bonding prepare the two different sets for bonding—in the first set bond the two pieces of set No 2 as they are, while in the second set put the up side of the second wafer from set No 1 down. Next, proceed to bonding and the following steps of the template preparation until it is determined in which case we have the two opposite crystallographic orientations (polarities). This step should be made only one time for each material case or until achieving confidence that we are going to bond pieces with opposite crystallographic orientations (opposite polarities).

4.2.—Applying pressure and temperature to bond the second wafer or the layer(s) (if such was (were) grown on this second wafer) with the opposite crystallographic orientation (polarity) to bond the two pieces in the pair together. The bonding may be performed in a professional wafer bonder, where the wafers in the pair are pressed against each other using weights. The wafers may be also pressed by the interatomic forces of heating if they are placed within a fixture made by a material with larger thermal expansion coefficients (for example, graphite) which is tightly inserted in a material with lower thermal expansion coefficients (for example, quartz), which is subsequently introduced into a furnace and heated. Depending on the materials the bonding temperatures could vary from about 300° C. to more than 1000° C. In the particular cases of GaAs and GaP, for example, $T_{bonding}$ is about 650-700° C. As for the bond force applied, a typical bond force is in the range of 1-50 kN. It is important for one to know that the material of the bonded layers on the first substrate and the second substrate is the same. Only their crystallographic orientations (polarities) must be opposite.

Step 5—After bonding, removing the common substrate(s) (unless it is a bonded layer), keeping the bonded layers undisturbed. The simplest scenario is if we have a pair that consists of one common substrate with a MOCVD-deposited layer of an NLO (non-linear optical) material on it bonded to a substrate of the same NLO material as the MOCVD layer, but having the opposite crystallographic polarity. In this case we simply remove only the common substrate. Two cases are possible: 1) if the bonded pair consists of a common substrate with a deposited layer of NLO material and a wafer from the same NLO material with opposite orientation, remove only the common substrate; 2) if the bond consists of two common substrates each with a deposited layer(s) of an NLO material on the substrates, remove both common substrates. This is possible only if the deposited/grown layer(s) is (are) thick enough to survive mechanically without attachment to a substrate. Removing the common substrate(s) may be done by a chemical etchant that attacks the substrate material, but does not damage on the deposited/grown layer material. The removal can be done by etching away the entire common substrate, or a large portion of the substrate may be removed in advance by rough polishing (it does not need to be precise). However, using only etching entirely eliminates the time consuming polishing procedure and the potential damage that any (even precise) polishing would leave on the polished surface, as well the mechanical strain in the layer resulting from the polishing. Polishing is not mandatory also because the thickness of the deposited layer is secured by the used deposition techniques (MOCVD or MBE). In addition, after the etching, the newly-exposed surface of the deposited/grown layer will have about the same smooth surface morphology as the common substrate that was removed.

Step 6—Patterning the top surface of the bonded pair according to the following steps:

6.1.—Spin coat the entire top surface of the bonded pair with photoresist.

6.2.—Expose the wafer with a mask on it with the desire pattern period to UV light.

6.3.—Develop the pattern using a certain solvent that leaves the desired photoresist pattern on the wafer.

6.4.—Etch the wafer using a dry etch process such as, for example ICP (Inductively Coupled Plasma) etching, to transfer the pattern into the wafer revealing both bottom and top orientations with opposite crystal polarities.

The disclosed method avoids and solves the following issues related to the preparation of orientation-patterned and, in general, patterned templates for subsequent thick or thin selective growth on them:

1. By using common substrates such as Si, as an example, this inventive technique eliminates the need to use semiconductor materials with low commercial quality (poor parallelism, high EPD, etc.) and a much higher price. Surface quality (based on EPD) and price per 2-inch Si wafers are compared in Table 3 with these of GaP and GaAs—two traditional materials used for preparation of OP templates.

TABLE. 3

A comparison of EPD and price (per 2-inch wafer) of GaP and GaAs with Si

| No | Material | EPD [$cm^{-2}$] | Price [USD] |
|---|---|---|---|
| 1 | GaP | $(8 - 10) \cdot 10^4$ | 585-685 |
| 2 | GaAs | $(1.5 - 5) \cdot 10^3$ | 87-90 |
| 3 | Si | <100 | 10-12 |

An additional consequence of the method disclosed herein is that one may eliminate the fly-cut step that aims to improve the poor parallelism of the related wafers and the subsequent step of polishing the traces left after the fly-cut; common substrates such as, for example, Si or Ge are prepared with extremely good parallelism.

2. By using a thin inverted layer of GaP (as an example) deposited on Si, e.g. by the MOCVD technique, this method secures the thickness of the inverted layer with an accuracy that corresponds to the accuracy of the control of the MOCVD growth process, which is a well-known process that yields high quality "epi-ready" layers with smooth surface morphology and uniform thickness.

Note: There is not a strict definition of what "epi-ready" surface means. If a crystalline surface is smooth enough (with RMS, for example, within 1 nm in a 5 μm×5 μm AFM scanning area), it should be able to provide conditions for high quality epitaxial growth—such a surface can be considered as "epi-ready".

3. The disclosed process eliminates the need of an etch-stop material and the deposition of the related etch stop layer, because such a layer is no longer necessary.

4. The disclosed process relies on the wafer bonding technique but eliminates the necessity of using expensive MBE equipment, including the deposition of an etch-stop layer or inverted layer on the etch-stop layer. Instead, the MOCVD technique is preferred for thin layer deposition as an industrially adopted process capable (in contrast with MBE) of multiple wafer processing. The disclosed process also eliminates the need for polishing equipment and, respectively, the time and effort for removal of the Si base(s) after bonding the two GaP surfaces—the GaP wafer and the Si wafer with the deposited thin MOCVD GaP layer on it. This is because after bonding Si can be entirely etched easily and quickly away with a chemical (etchant) that will not attack GaP. A variation of the process still may include a rough polishing to remove most of the Si-wafer material and thus to reduce the time of etching, but this is not mandatory because there are a number of available chemicals that etch Si aggressively without attacking GaP.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

FIG. 6A depicts a Nomarski optical microscopic image of the top surface of homoepitaxially grown OPGaP on an OPGaP template with domains oriented in two mutually perpendicular directions, i.e. area A: along [01$\bar{1}$] direction (perpendicular to the major wafer flat) and area B: along [011] direction (perpendicular to the minor wafer flat);

FIG. 6B depicts an optical image of an area in which the domains are oriented along [01$\bar{1}$];

FIG. 6C depicts an area in which the domains are oriented along [011];

FIG. 6D is a schematic of the standard orientations of the major and minor wafer flats.

FIG. 7A depicts that bonding GaP wafers leaves underneath voids between the wafers which could be distributed on large, useless parts of the bonded surface;

FIG. 7B depicts that, due to their better parallelism, this never occur when bonding two GaAs wafers;

FIGS. 10A-10B depicts a schematic (at left) and Nomarski microscopic cross sectional images (at right) showing some common mistakes during the preparation of OPGaP templates due to the absence of etch-stop material that lead to having access to only one of the crystallographic orientation: In FIG. 10A the upper layer was not etched enough deeply, and in FIG. 10B the upper layer was completely polished-off;

FIG. 16A depicts a schematic of MOCVD-grown GaP/Si before bonding to another GaP wafer with opposite polarity;

FIG. 16B depicts a schematic of an HVPE-grown GaP layer on MOCVD GaP/Si before bonding to another GaP wafer with the opposite polarity;

FIG. 16C depicts a schematic of two MOCVD GaP/Si (or, as another variation, two HVPE GaP/MOCVD GaP/Si) wafers with opposite polarities before the pairs are bonded together;

FIG. 18A depicts a top surface view of an OPGaP template fabricated by the wafer fusion (wafer bonding) technique. The period of the pattern is 63 μm;

FIG. 18B depicts a top surface view of an OPGaP template fabricated by the MBE assisted polarity inversion technique. The period of the pattern is 86 μm; and FIG. 19 presents details regarding several exemplary heteroepitaxial cases.

Figures 1A, 1B, 1C:
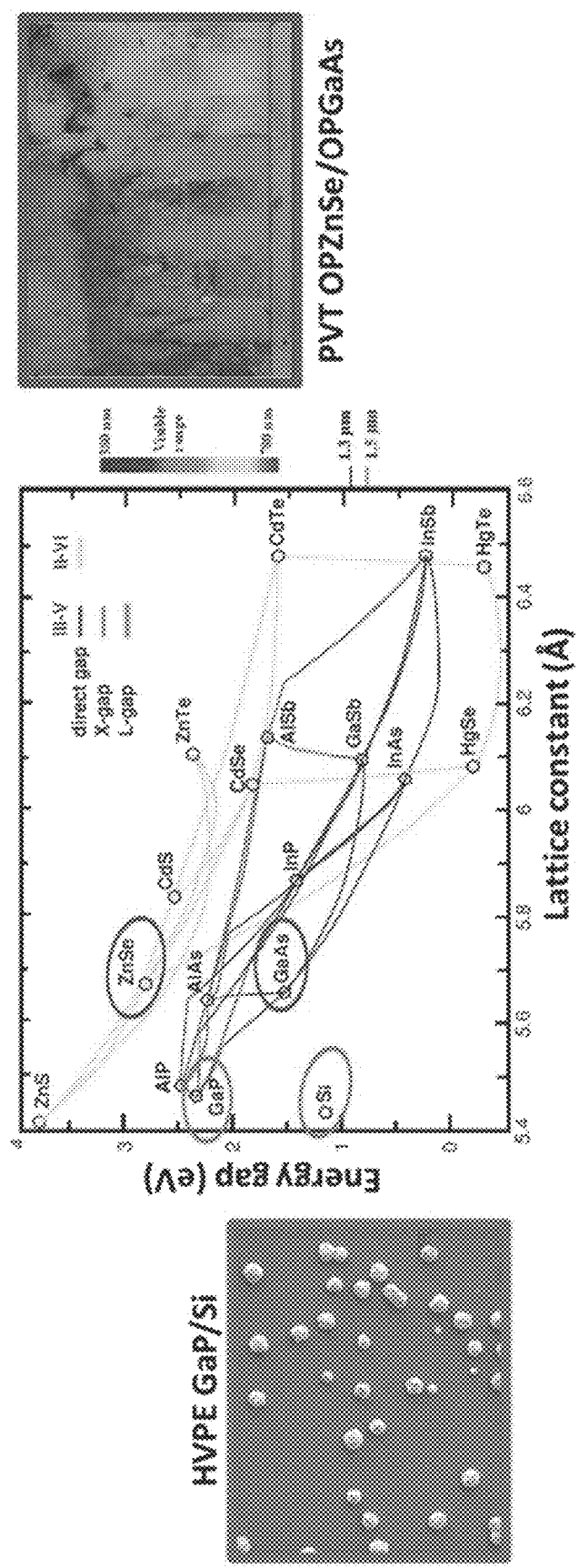
FIG. 1A depicts HVPE growth of GaP directly on Si.
FIG. 1B depicts band gap energy versus lattice constant for some of the most popular semiconductor materials.
FIG. 1C depicts PVT growth of OPZnSe on an OPGaAs template.
Figure 2A:
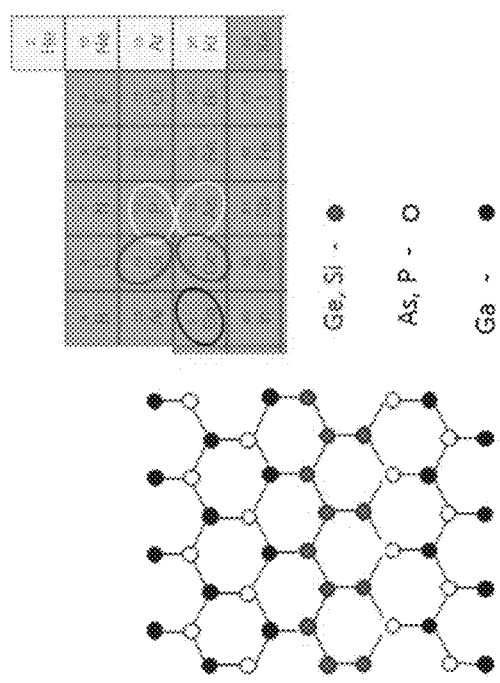
FIG. 2A depicts deposition of sub-lattices from a suitable non-polar material on the polar substrate to polish off its polarity.
Figure 2B:
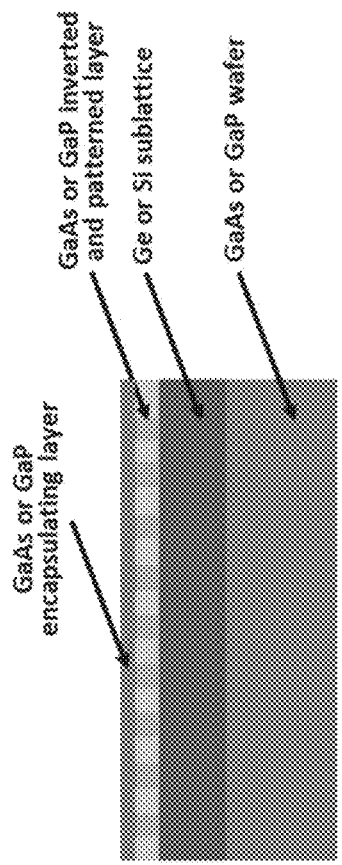
FIG. 2B depicts a schematic of layers deposited on the substrate during the preparation of OP template.
Figure 3B:
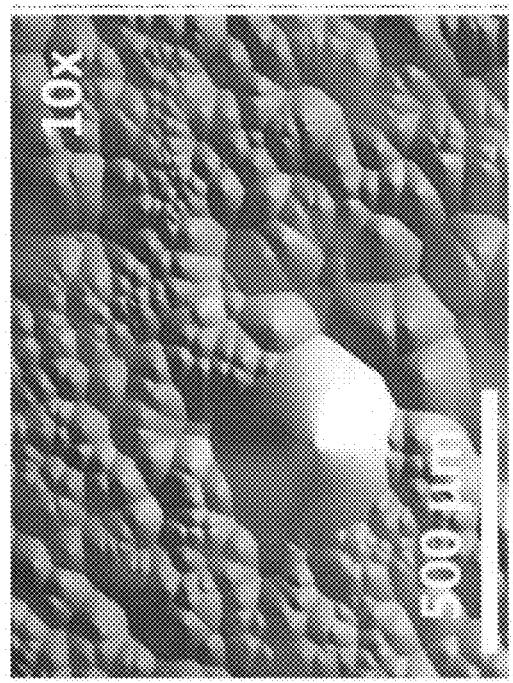
FIG. 3B depicts growth of GaP on an "on-axis" (100) GaP wafer.
Figure 3A:
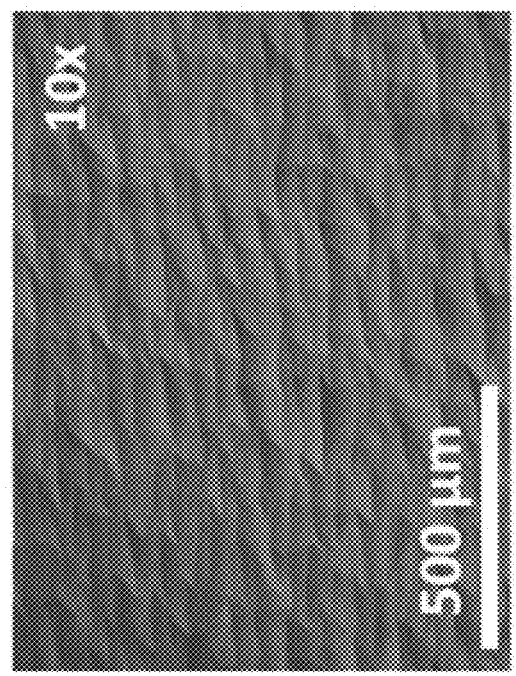
FIG. 3A depicts growth of GaP on a (100) GaP wafer with 4° miscut toward (111)B.
Figure 4B:
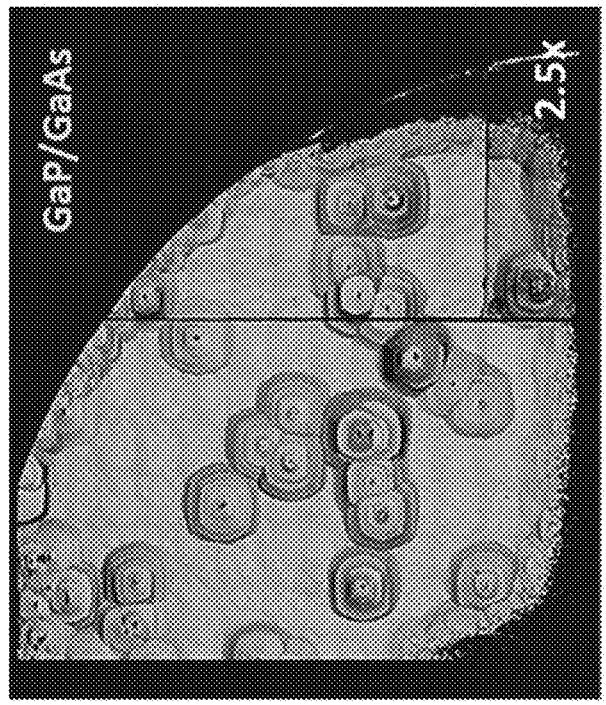
FIG. 4B depicts heteroepitaxially grown GaP on "on-axis" (100) GaAs.
Figure 4A:
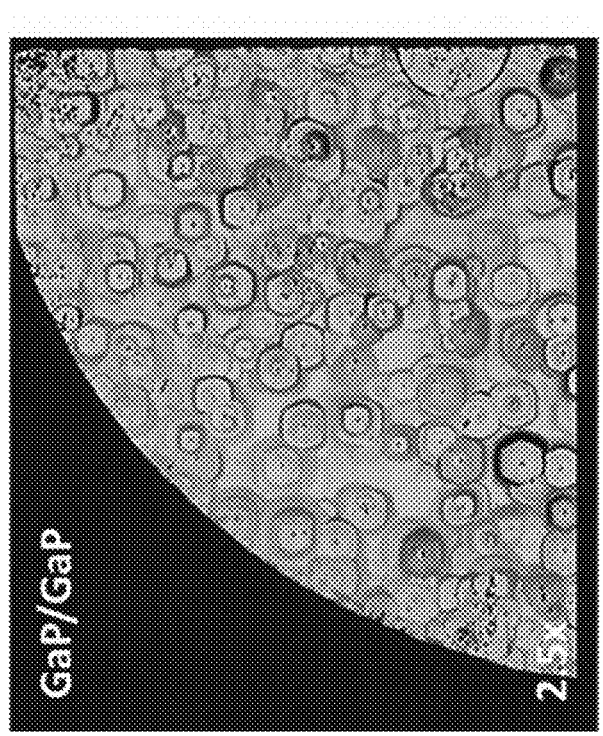
FIG. 4A depicts top surfaces of homoepitaxially grown GaP on "on-axis" (100) GaP.
Figure 5:
FIG. 5 depicts a Nomarski optical microscopic image of the top surface of OPGaP grown homoepitaxially on an "on-axis" (100) OPGaP templates.
Figure 8:
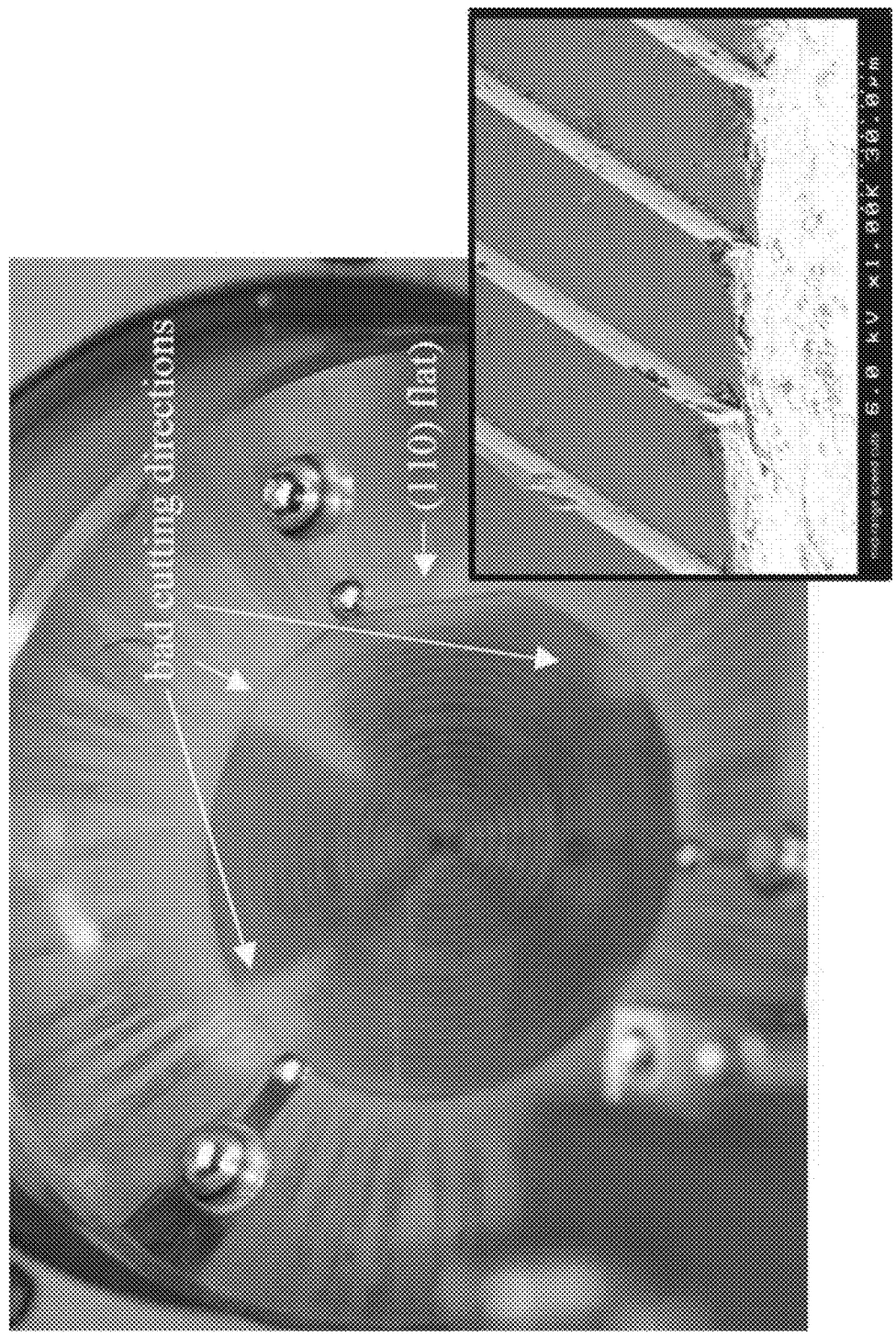
FIG. 8 depicts machined GaP wafer that shows good and bad cutting directions and the grooves left by the fly-cut.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The proposed approach is focused on one of the two well-known methods for preparation of OP templates—the MBE assisted polarity inversion process and the wafer fusion bonding, proposing a new concept for the wafer bonding. This new process eliminates the use of expensive MBE equipment in the preparation of OP templates, although MOCVD is still necessary for the deposition of the GaP inverted layer during the first stage of OP template preparation.

The advantages of the proposed method for preparing OP templates, given as an example, for a subsequent thick growth on them for QPM structures for frequency conversion and, in general, any patterned templates for any subsequent thin or thick selective growth on them are:

1. Substituting the MBE assisted polarity inversion process with the cheaper, low-tech wafer bonding technique that does not require the use of an MBE machine. The worldwide supply of MBE OP templates is extremely limited. Accordingly, their price is extremely high (reaching $9,500 per 3-inch wafer). This is due not only to the fact that polarity alternation in the MBE process, relying on a very narrow range of growth conditions, is sensitive, i.e. it is almost a random event—it may occur, it may not. It is also because the MBE growers are affirmed that once a Ge source, for example, is introduced into an MBE chamber in order to assist in the polarity inversion during the OPGaAs template preparation, they can never get rid of traces of Ge. It is the same in the case of an MBE machine that is used for OPGaP template preparation when a Si-source must be, respectively, introduced in the MBE chamber.

2. Replacing at least one of the expensive semiconductor wafers (in one of the variations of the two) with the extremely inexpensive, high quality common wafer(s), strongly increases the chances for preparation of patterned templates with much higher quality at a much lower price in a simpler, low tech, process. This is a precondition for a better subsequent growth on the template and at a drastic reduction of the final product price.

3. Using a combination of materials (for example GaP and Si), one of which (e.g. Si) that can be easily removed by etching using chemicals that does not damage the other one (e.g. GaP) entirely avoids the time- and effort-consuming polishing procedure, as well as using expensive polishing tools and supplies. In addition, avoiding polishing procedures also means avoiding surface damage and additional mechanical strain left in the layer after the polishing. The avoidance of steps such as the fly-cut and the following step of fine polishing to remove the damages left from the fly-cut additionally contributes to the higher quality and lower price.

4. Depositing the template layer by MOCVD has advantages; MOCVD is a well-known technique that provides high quality epi-ready layers with smooth surface morphology and uniform thickness. MOCVD has been used to heteroepitaxially deposit thin layers of materials having large lattice mismatches with their substrate. One example is the deposition of AlN or GaN on sapphire at mismatches as high as 35% and 33%, followed by a thick growth on these layers of, for example, GaN on AlN (lattice mismatch only 2.5%) using a technique for thick growth such as, for example, HVPE. Other examples, already described above, are: thick HVPE growth of GaP on thin MOCVD GaP/GaAs, thick HVPE GaAs deposited on thin MOCVD GaAs/Ge, thick HVPE ZnSe deposited on thin MOCVD ZnSe/GaAs or, again, thick HVPE ZnSe deposited this time on thin MOCVD GaAs/Ge, etc. The key for success is the proper combination of a far-from-equilibrium technique (MOCVD or MBE) that provides better conditions for a 2D growth (thus does not rely on surface defects) with a growth process that is close-to-equilibrium technique (HVPE) which provides conditions for fast, thick epitaxial growth. The suitable combinations between substrate and growing layer, which undoubtedly depend on the lattice and thermal matches between them, is also important, as well as the goal of the growth, e.g. thin or thick growth, bearing in mind that while lattice mismatch always does matter, thermal mismatch is not that important for thin layer growth. With all this in mind, the proposed approach for the preparation of patterned templates is nearly universal. More details are presented below.

5. One of the important advantages of the proposed approach is that it does not need any etch-stop layer to secure the thickness of the inverted layer, because Si can be etched entirely by a chemical that will not damage the other material, e.g. GaP.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

A common substrate, as it was explained in more detail above, is a substrate from a material that is widely commercially available in the shape of standard 2, 3 etc. inch wafers at a reasonable price and relatively high quality measures such as uniform thickness, good parallelism and smooth surface morphology with low EPD, etc. These wafers are preferably marked with the standard major and minor flats and prepared by common, mature growth techniques such as CZ (Czochralski) or EFG. Excellent examples according to this classifications are sapphire, Si, Ge, or to some extent, even, GaAs. However, due to its price, lower quality and limited presence on the current semiconductor market GaP, for example, shall be considered as a less common material. In addition to that, all commercial GaP substrates are n-type with the exception of the purposely doped semi-insulating (SI) GaP. The disadvantage of the n-type GaP is that due to free n-carriers the n-type GaP has an additional absorption band in the very inconvenient for any infrared applications range between 2-4 µm. We would like one more time to point out that the definition of "common" is rather broad than strict. For example, GaSb with its higher price (see Table 1) from first sight shall not be considered as a "common" substrate. However, GaSb is commercially available and matches very well with an excellent nonlinear optical material —ZnTe (+0.083%) which, in addition, is not available in crystalline form in practically large sizes. This means that ZnTe (2-inch) crystalline substrates are not available, so if we would like to grow ZnTe (or OPZnTe) the only option is to grow ZnTe heteroepitaxially, as the best choice is to grow it on GaSb substrates, or, eventually, on OPGaSb templates, which do not exist, yet. This means that at a certain point we must "promote" GaSb as a common substrate, such as through the application of the disclosed method. And, if ZnTe cannot be grown on GaSb directly by HVPE, then it may be first necessary to deposit a thin layer of ZnTe on the GaSb substrate by MOCVD and from there to try to fabricate an OPZnTe template. All this shows that this approach for template preparation may have many alternative variations including many more materials and combinations of them than in the examples presented here—for more examples of favorable variations see FIG. 19.

For many materials growth in some less common directions (with larger Miller indexes) is not well-understood, yet. Growth in such directions meets more difficulties and, in general, is slower. This comes from the fact that larger Miller indexes correspond to larger surface energy (a), which means more work is needed to form such surfaces. For many materials the dependence of the surface energy from the Miller indexes goes:

$$\sigma_{100} < \sigma_{110} < \sigma_{111} < \sigma_{211} \quad \text{(eq. 1)}$$

In addition, machining a boule grown in a common direction to fabricate wafers with uncommon orientations makes such wafers more expensive. That is why (111) wafers typically cost more than (001) wafers from the same material. There are other more detailed considerations that recommend the avoidance of such growth or using substrates with higher Miller indexes. For example, according to FIG. 15, where a zinc-blende (GaAs, GaP, etc.) crystal cell is shown, crystallographic planes like $ADD_1A_1$ (Miller indexes [110]) and $CBB_1C_1$ (Miller indexes [1T0]) have all bonds satisfied, i.e. there are no net charges or any electrostatic forces, which makes them easy to cleave or etch, in contrast to planes such as ADC' (Miller indexes [111]) which are not electrostatically balanced. Of course, sometimes avoiding the higher Miller index directions in the preparation of patterned templates is not always the best solution, because some materials or phases of one and the same material fit better to such higher index crystallographic planes. For example, cubic GaN fits better to a (100) GaAs substrate, whereas (111) GaAs is a better match for the hexagonal GaN. Similarly, ZnSe can be also grown on (110) GaAs or on (100) Ge substrates, or GaSe can be also grown on (111)B GaAs substrate, etc. GaSe is also a good example that different phases of the same material may fit better to different substrate materials. For example, growth of α-phase cubic $Ga_4Se_6$ may be grown on GaP or even on GaAs substrates, while GaN would be a more suitable substrate for the growth of β-phase hexagonal GaSe (see FIG. 19). The other question, however, is how difficult is it to alter polarity when preparing OP templates using wafers with higher Miller indexes. In conclusion, although the preparation of OP templates using less common substrate materials or substrates with less common orientations sounds less reasonable, there are, obviously, situations when we may have no other options, which makes the other variations of this disclosure.

In this text we will use, as an example, GaP as a material that possesses a structure with large number alternating domains with opposite crystallographic orientations. In this particular case Si will be used as at least one of the two wafers for bonding in the pair. Namely, on the Si wafer, a thin layer of GaP will be deposited before the two pieces are bonded together. However, frequently in the following text we will refer to alternative material combinations too, emphasizing here that Si and GaP are suitable examples, as well as GaAs and Ge, or some other material choices.

The choice of common pairs such as GaP and Si, or GaAs and Ge, or even of less "common" pairs such as GaP and GaAs, ZnSe and GaAs, ZnTe and GaSb, or cubic GaSe and GaP (or GaAs), etc. are, definitely, prompted by the close lattice match between each of these two materials. However, due to the nature of the proposed approach, where a close-to-equilibrium growth process (HVPE) is combined with a far-from-equilibrium process (MOCVD or MBE), chance are given even to materials that do not match that well. This comes from the fact that by a far-from-equilibrium process we can grow heteroepitaxially thin layers up to 1-2 µm on foreign substrates even at larger lattice mismatches—as in the previously provided example of growth of AlN or GaN on sapphire shows. The combination of a close-to-equilibrium process with a far-from-equilibrium process for the purpose of preparation of OP-templates is another important variation of the approach proposed in this disclosure.

I. Steps of (OP) Template Preparation

Figure 13C:
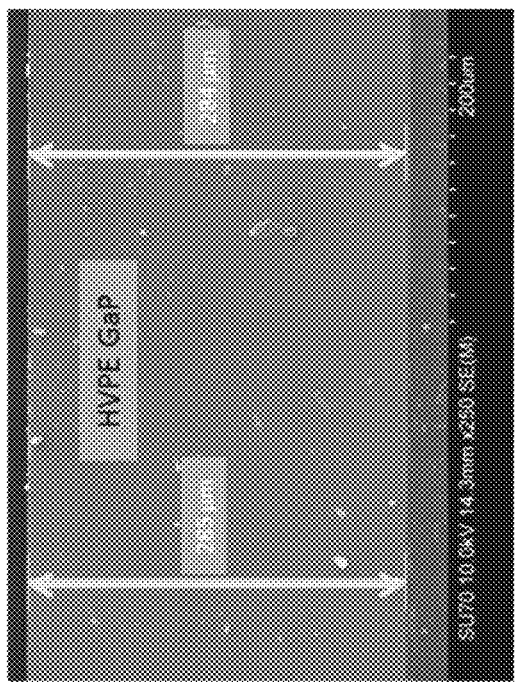
FIG. 13C depicts an SEM cross section image of a near 300 μm thick HVPE GaP layer grown on a MOCVD GaP/Si substrate—the top surface images of the same sample are shown in FIGS. 12B, 13B (the lower image), and FIG. 14.
Figure 13B:
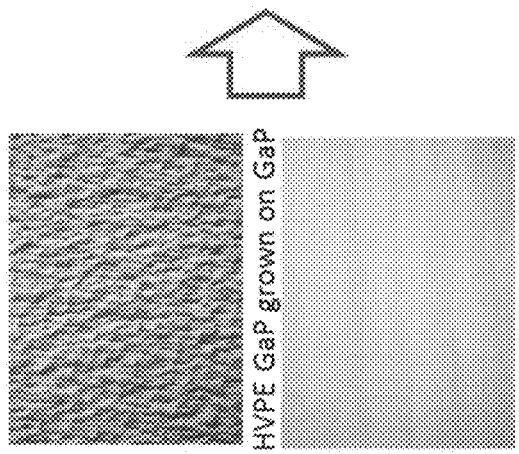
FIG. 13B depicts Nomarski top surface images of a direct homoepitaxial HVPE growth of GaP on a GaP substrate (upper image) and HVPE GaP grown on thin MOCVD GaP/Si (lower image)
Figure 13A:
FIG. 13A depicts HVPE growth of GaP directly on Si.

There are several steps in the (OP) template preparation explained below:

1. Deposition of a thin GaP layer (as an example) on Si (as an example) by a far-from-equilibrium growth process such as MOCVD (as an example):

Direct deposition of a thick GaP layer on a Si wafer using a close-to-equilibrium process (HVPE), as mentioned above, was unsuccessful, resulting in a few small GaP crystallites distributed randomly on the Si substrate (see FIG. 1A and FIG. 13A). The reason for such a result comes from the fact that a close-to-equilibrium process provides low supersaturation, and nucleation needs "an excuse" to initiate, i.e. a good amount of defects such as, for example, ends of a screw dislocations that provide plenty of free sites for the atoms approaching the substrate surface to adhere there. At the same time the more neighbors to which the "newcomer" is going to be bonded, the more energy will be released, which is thermodynamically more favorable because it keeps the system at a lower energy level. That is why, namely, the low EPD of Si (see Table. 3) was the reason for the HVPE growth of GaP/Si to be incapable of producing a continuous GaP layer—Si is just too perfect to cooperate with the HVPE growth technique. In order to initiate growth on a clean, near defect-free crystal surface when the approaching atoms have the opportunity to be attached to only one neighbor underneath, high supersaturation that supports 2D growth is necessary. MOCVD and MBE, by the huge amounts of precursors "spit" over the substrate, are such processes. That is why MOCVD and MBE can succeed in cases when HVPE cannot.

The deposition of this thin polar semiconductor layer (GaP) on top of the non-polar common substrate (Si) can be performed with or without the deposition of a low or high temperature intermediate transition buffer layer that may help in releasing the elastic strain that builds as a result of the lattice and thermal mismatches between substrate and growing layer.

The MOCVD grown GaP layer grown on the Si-substrate can be with extremely high quality (see FIG. 12A), epi-ready for the subsequent thick HVPE growth on them.

Figure 12B:
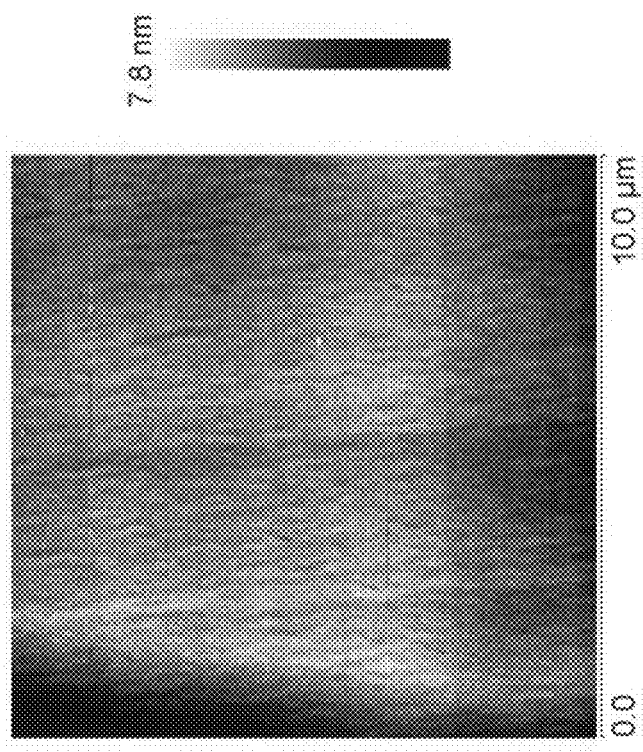
FIG. 12B depicts 285 μm thick HVPE GaP deposited on the MOCVD GaP/Si of FIG. 12A—the RMS of both are about the same. This means that the MOCVD GaP provides high "epi-ready" quality for the subsequent thick HVPE growth.
Figure 12A:
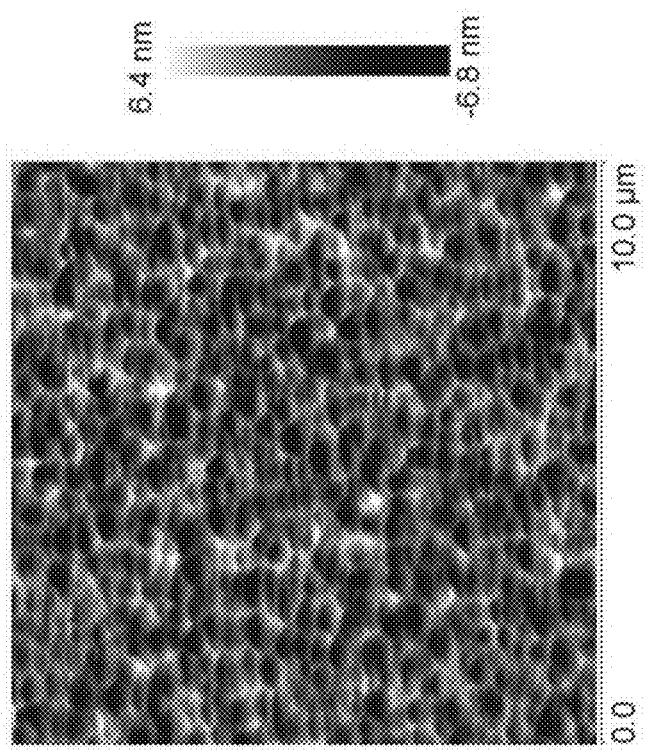
FIG. 12A depicts AFM images of the top layer surface of a 250 nm thin MOCVD GaP deposited on Si.

FIG. 12A presents AFM images of the top layer surface of a 250 nm thin MOCVD GaP deposited on Si.

2. Thicker HVPE growth of GaP on the thin MOCVD GaP layer deposited on Si—optional. The application of this optional step depends on whether the thin (MOCVD or MBE) layer can survive without thermal decomposition or cracking during the subsequent bonding procedure.

While far-from-equilibrium processes such as MOCVD and MBE are suitable for thin (up to 1-2 μm) film growths, they are incapable of growing of thicker films. In contrast, close-to-equilibrium processes such as HVPE by providing about equal probability for the formation and the disintegrations of nuclei on the crystal surface are traditional techniques for fast thick (hundreds of microns) layer growths. In this point of view, combining these two completely different by nature processes (HVPE with MOCVD or with MBE would be a great option for a thick growth on a too perfect substrate or, on the contrary, a substrate that has larger lattice mismatch with the growing layer.

As an example for the advantage of such combination, we demonstrate (see FIG. 13C) that a near 300 μm thick GaP layer with high crystalline quality and smooth surface morphology (see FIG. 12B and FIG. 13B—the lower image) may be grown on a thin MOCVD GaP layer deposited in advance on the Si substrate. This is an approach that combines a thin heteroepitaxial growth (MOCVD GaP/Si) with a thick homoepitaxial growth (HVPE GaP/MOCVD GaP/Si), applied for the purpose of making orientation-patterned and, in general, patterned templates.

FIG. 12B presents an AFM image of the top surface of a 284 μm thick HVPE GaP deposited on the MOCVD GaP/Si, which top surface AFM image is shown in FIG. 12A. One can see from the bars at right of the two images that the average surface roughness (RMS) in both cases is about the same—6-8 nm in a 10 μm×10 μm AFM scanning area. FIG. 13A presents a Nomarski top surface image of HVPE growth of GaP directly on Si: as it was already mentioned this growth resulted in only small-dimension single GaP crystallites, but not a continuous GaP layer; FIG. 13B (upper image) presents a Nomarski top surface image of a direct homoepitaxial HVPE growth of GaP on a GaP substrate; FIG. 13B (lower image) shows a Nomarski top surface image of HVPE GaP grown homoepitaxially on thin MOCVD GaP/Si. A comparison of the upper with the lower image of FIG. 13B shows that the typical for the homoepitaxial GaP/GaP growth "orange peel" type surface texture (upper image) is missing in the lower image, which demonstrates that the MOCVD-HVPE combination has led to smoother surface morphology, which is a great precondition for the following bonding procedure. This thick HVPE GaP growth on the thin MOCVD GaP layer, as the XRD and AFM studies indicated, resulted in high crystalline quality (FWHM<50 arcsec) and extremely smooth surface morphology (RMS<1 nm). FIG. 13C presents an SEM cross section image of a near 300 μm thick HVPE GaP layer grown on an MOCVD GaP/Si substrate. The top surface images of the material of FIG. 13C are shown in FIGS. 12B, 13B (the lower image), and 14. This confirmed the benefits not only of combining two materials but also of two growth approaches, i.e. a close-to-equilibrium method and a far-from-equilibrium method.

Figure 14:
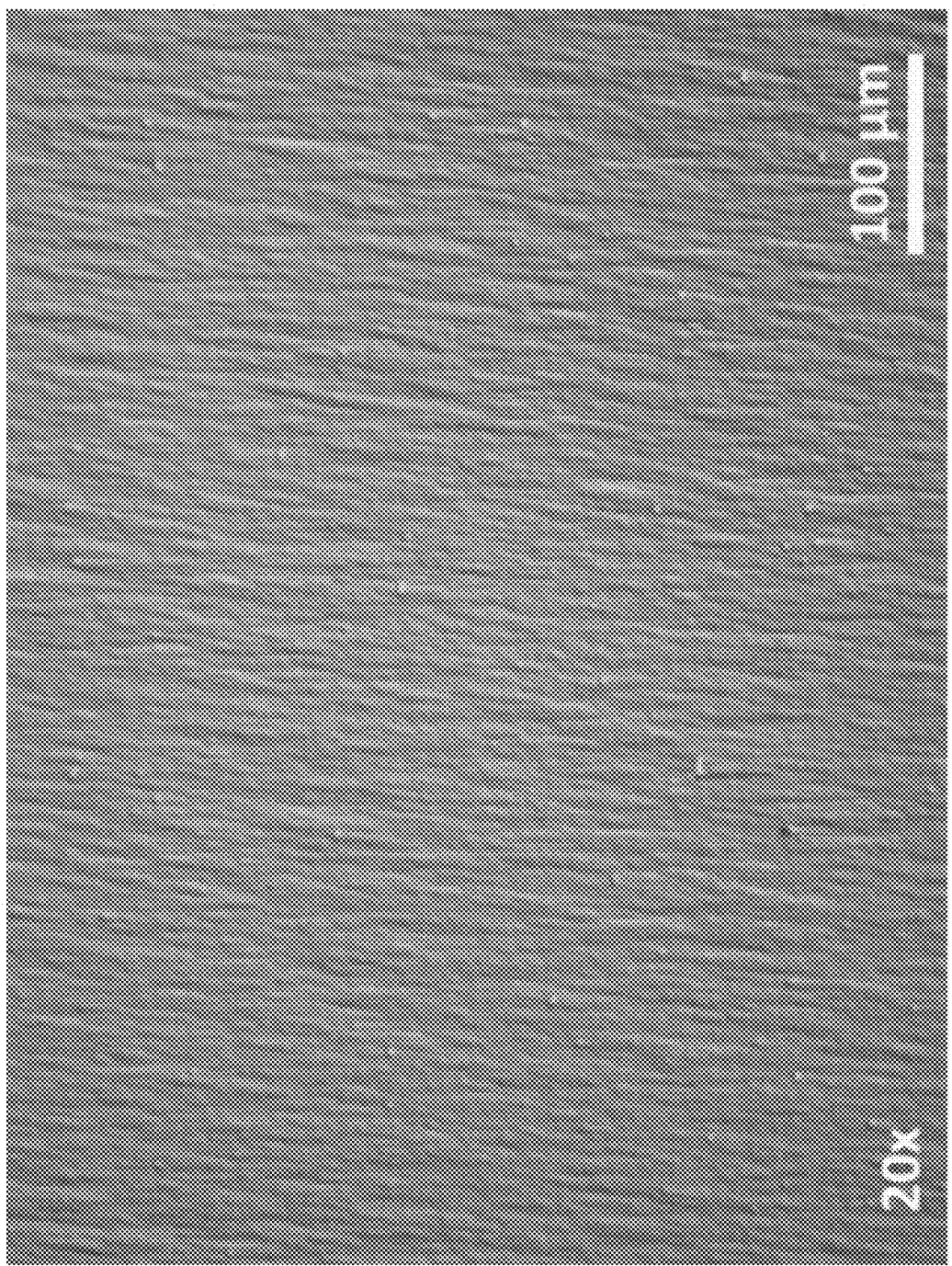
FIG. 14 depicts the top surface Nomarski image of the 300 μm thick HVPE GaP/MOCVD GaP/Si of a sample shown also in FIGS. 12B, 13B (the lower image), and FIG. 13C (its cross section)

FIG. 14 presents a Nomarski top surface image of the sample shown in FIGS. 12B and 13B (lower image). As shown, the HVPE layer has such a smooth surface morphology that will allow it to bond well with another GaP wafer. The growth may be continued to gain more thickness, if desired.

Thick growth of GaP on Si may have a number of optoelectronic applications but in the case of OP template preparation adding of some extra thickness to the previously-grown MOCVD GaP layer is an optional step, which provides some additional protection of the thin MOCVD GaP layer against its eventual thermal decomposition or cracking during the bonding process.

The proposed approach of combining one thin with one thick growth process allows thick growths of materials with completely incompatible substrates. Moreover, taking into account the lattice and thermal mismatches, we could achieve growths of multi-material heterostructures. For example, starting with MOCVD hetero-growth of GaP/Si we could continue with homoepitaxial HVPE growth of GaP/GaP (as in our example), and continue with HVPE heteroepitaxy of GaAs/GaP (an already proven case), and after that further to continue, for example, with HVPE heteroepitaxy of ZnSe/GaAs. At the same time the base substrate could be another material than Si, for example Ge, starting with a thin MOCVD heteroepitaxy of GaAs/Ge, etc., etc. Such structures could have great impacts on developments in optoelectronics—and not only there—leading to other practical applications that could easily step beyond the scope of the idea proposed here.

3. Bonding the Si wafer with the deposited thin MOCVD GaP to a GaP wafer with the opposite polarity. A variation of this process is if we perform the bonding after the deposition of a thicker HVPE GaP layer on the thin MOCVD layer, as was already explained.

Before bonding one should bear in mind that, for use in frequency conversion devices, the two bonded pieces must have opposite crystallographic polarities. A certain crystal polarity may be recognized by some growth features on the surface layer—features that are more inherent to one or the other polarity. The surfaces of the opposite polarities also respond differently to etching (etch pits with different shapes or orientations, as well different etching rates for the two opposite orientations), so this may be another indication of which polarity is which. Another technique that uses the different response of the opposite oriented surfaces when exposed to non-native precursors (e.g. exposing GaP to $AsH_3$ or exposing GaAs to $PH_3$, etc.) is described in the following texts as well. Accordingly, we could use these techniques to confirm, before bonding, that the two surfaces have opposite polarities. It is more important to know that the polarities are opposite than to know which polarity is which, i.e. to know the exact polarities. Thus, we may bond to the Si wafer with the deposited MOCVD GaP layer (or, as it is in the above-mentioned variation, the Si wafer with the deposited thicker HVPE GaP on the thin MOCVD GaP layer) another wafer of plain (100) GaP wafer. If in the subsequent steps of template preparation it turned out that both polarities are not presented, a second attempt must be made, but this time to bond the Si-wafer (with the GaP layer(s) on the top) to the opposite face of the second wafer, the plain GaP wafer. A second bonding option (another variation of the bonding process) comes from the fact that the polarity of the zinc-blende structure (see FIG. 15) alternates at a 90 degree rotation around the [001] axis (Ga atoms down ($ADD_1A_1$) and Ga atoms up ($CBB_1C_1$)). This means that a simple 90° rotation of one of the wafers will ensure the bonding of pieces with opposite polarities, as well. In this case we have to bond the GaP layer of the GaP/Si-wafer to the second GaP, or to the layer(s) of another GaP/Si wafer (see FIGS. 16A-16C), making again two bonding attempts—as the second one should be not after putting the wafers upside down (as it is in the first presented variation of bonding) but after its rotation at 90 degrees around the [001] axis. In all these attempts the Si-wafer flats may be used as a landmark, although it is not clear, yet, whether the MOCVD grown GaP layers will have an orientation that corresponds to the same flats.

Figure 15:
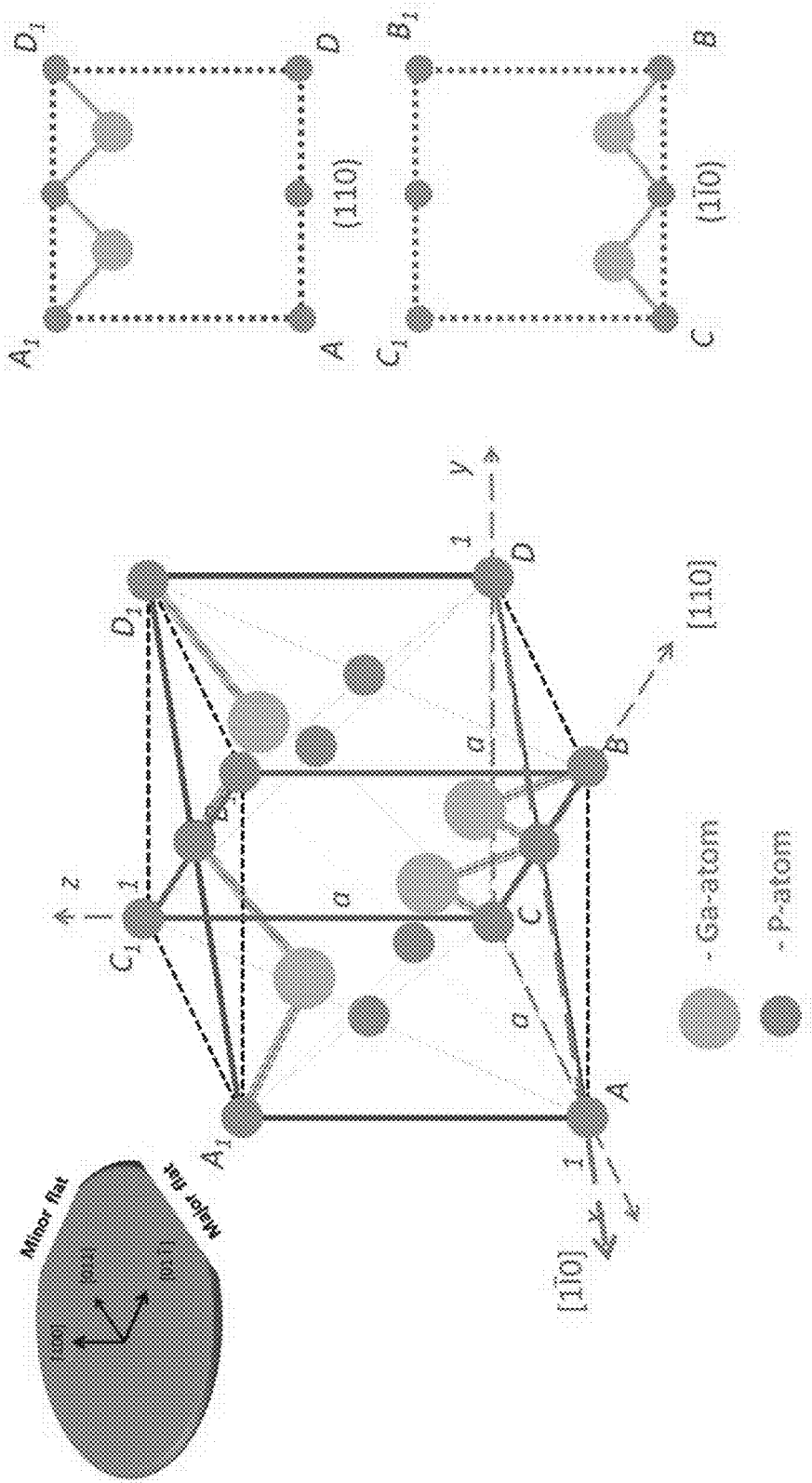
FIG. 15 depicts a schematic of zinc-blende structure of GaP: the polarity alternates with 90 degree rotation around [001] as one can see on projections $ADD_1A_1$ (Ga-atoms down) and $CBB_1C_1$ (Ga-atoms up)

FIG. 15 presents the zinc-blende structure of GaP: the polarity alternates at a 90 degree rotation around [001] as one can see on projections ADD1A1 (Ga-atoms down) and CBB1C1 (Ga-atoms up).

Once the proper orientation for bonding the two parts with opposite polarities is determined, this step should not be repeated in the future bonding attempts, and the process should proceed to the routine bonding procedure. This routine bonding procedure may be done technically in different ways (explained below in [00118]), but, in general, the two wafers should be simply kept in close contact gently pressing them against each other at a high enough temperature for a period sufficient to allow irreversible diffusion.

FIGS. 16A and 16B present the two previously discussed cases of bonding of pieces with opposite polarities: (1) bonding an MOCVD GaP/Si substrate to a GaP wafer (FIG. 16A); and (2) bonding a thicker HVPE GaP/MOCVD GaP/Si to a GaP wafer (FIG. 16B). The third case shown in FIG. 16C represents a bonding of a thin MOCVD GaP/Si (or a thicker HVPE Ga/MOCVD GaP/Si) to the same type Si-based substrate. This third case should additionally improve the bonding because, in contrast to the first two cases, both pieces in the pair have the good parallelism of the Si wafers.

Figure 17C:
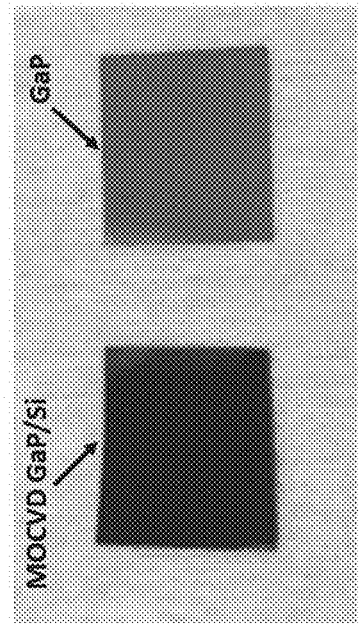
FIG. 17C depicts SEM cross sectional image of the bonded samples from FIG. 17B (but with the Si-base not removed, yet) revealing the MOCVD GaP layer between the two major parts of the bond, the GaP and the Si part.
Figure 17B:
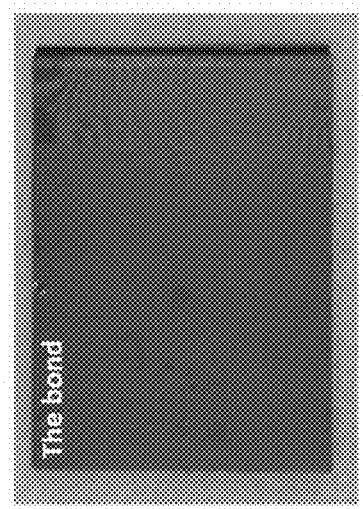
FIG. 17B depicts the two samples of FIG. 17A after bonding together (and completely removing, e.g. by etching, the Si-base)
Figure 17A:
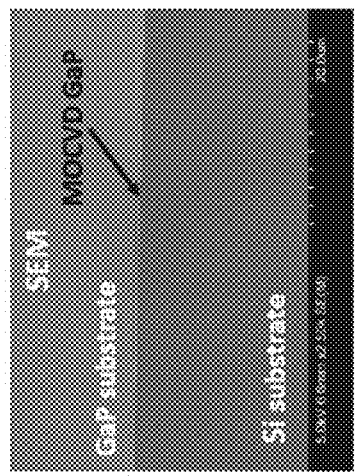
FIG. 17A depicts two samples, one Si sample with a 250 nm thin GaP deposited on it by MOCVD and one 350 μm thick plain (100) GaP commercial substrate before bonding.

Next FIG. 17A depicts two samples, one Si sample with a 250 nm thin GaP deposited on it by MOCVD and one 350 µm thick plain (100) GaP commercial substrate before bonding; Next FIG. 17B depicts the two samples of FIG. 17A after bonding and completely removing (e.g. by etching) the Si-base; Next FIG. 17C depicts an SEM cross sectional image of the bonded samples from FIG. 17B, but with the Si-base still in place, revealing the MOCVD GaP layer between the two major parts of the bond, the GaP and the Si part.

We have performed the wafer bonding using two different sets: 1) in set 1 the wafers were placed together in a graphite nest which is introduced tightly within a thick quartz tube. The thick quartz tube with the graphite nest inside is introduced in the reactor tube, which was heated with a resistive heater to about 650° C. in the presence of $N_2$ flow at atmospheric pressure. In order to prevent the GaP surfaces from thermal decomposition, which may start at a much lower temperature (350-400° C.), the two surfaces in this variations of the bonding procedure (set 1) were mechanically gently pressed against each other. The pieces during the bonding were also kept at atmospheric pressure in a flow of $PH_3+N_2$ mixture. In this process due to the fact that the thermal expansion coefficient of graphite is larger than the thermal expansion coefficient of quartz, the two wafers are pressed against each other by the thermal interatomic forces; 2) In set 2 the wafers were bonded in a standard commercial bonder and maintained for about 4 h at 450° C. while pressing the upper wafer with about 10 kN against the lower wafer.

4. Etching the Si Wafer(s).

In contrast to the traditional wafer fused (wafer bonding) OP template preparation process, the removal of the Si part of the bond (the Si wafer/substrate on which a GaP layer(s) was (were) already deposited) the proposed approach does not require any time- and effort-consuming, precision polishing procedures. This is because Si may be etched entirely and relatively quickly using deep-reactive ion or wet etching procedures that efficiently etch Si but do not etch GaP at all. This means that both the GaP layer(s) deposited on the Si wafer and the GaP wafer bonded to it (see FIGS. 16A and 16B) (or the GaP layer(s) deposited on the second Si wafer, according to one of the variations of the bonding (see FIG. 16C) should be fully protected from the Si-etchants. One example of the chemical recipe involves $SF_6$ (Sulfur hexafluoride) with a typical etch rate of 10 µm/min.

Figure 9:
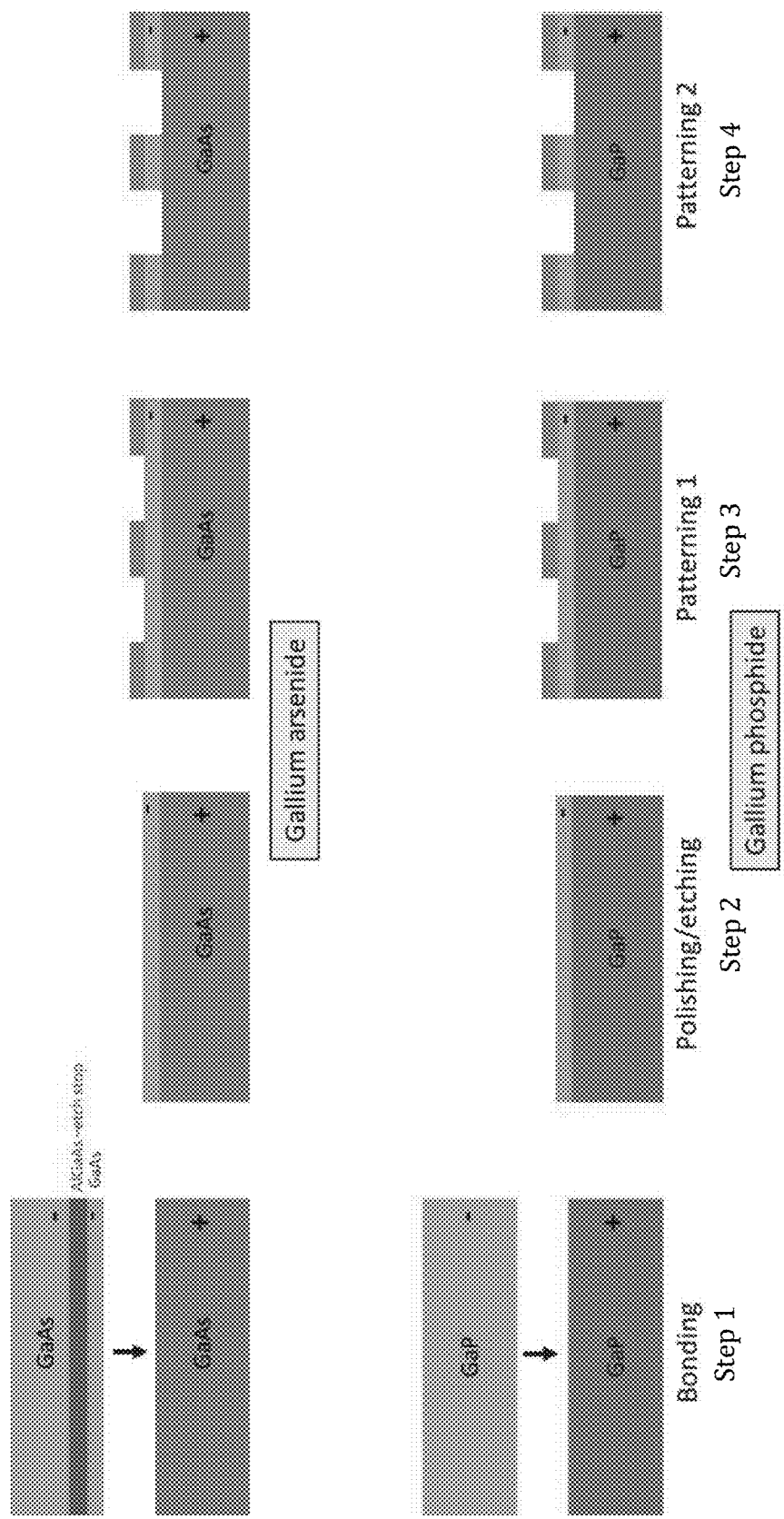
FIG. 9 depicts a schematic of the steps of fabrication of OPGaAs (upper image) and (OPGaP) (lower image) templates.
Figure 11:
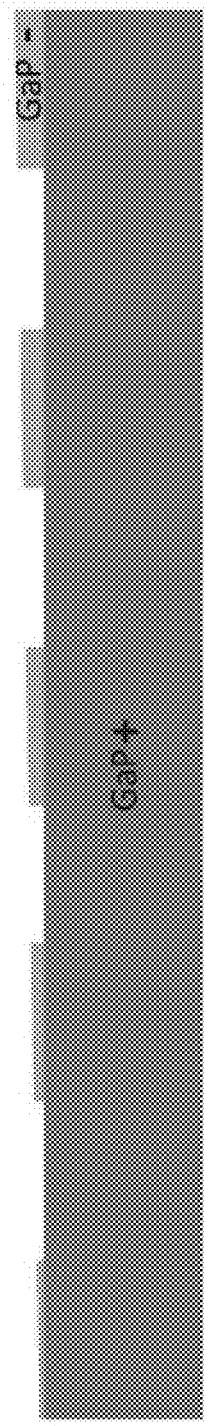
FIG. 11 depicts a schematic of a ready OPGaP template with an inverted layer with reducing thickness along the template length due to polishing in a tilted direction that comes from the poor wafer parallelism.

The proposed technique for OPGaP template preparation, actually, eliminates the need to deposit an etch stop layer so there is no more need to search for such an etch-stop material for the case of OPGaP template preparation. In addition, the accuracy of the MOCVD (or MBE) growth itself precisely secures the uniform thickness of the inverted GaP layer. Thus the patterning continues step by step as is shown on FIG. 9.

FIGS. 18A and 18B depict typical top surface views of two OPGaP templates with different periods (63 and 86 µm), one fabricated by the wafer fusion (wafer bonding) technique (FIG. 18A), and one by the MBE assisted polarity inversion technique (FIG. 18B). The images illustrate that the two techniques provide OP templates with similar quality, but obviously, at a different price, in favor of the cheaper optimized wafer fusion (bonding) technique disclosed herein.

5. Patterning the Top Surface of the Bonded Pair as a Last Step of the Fabrication of the OP-Template.

As a first step of the patterning process the entire top surface of the bonded pair is coated, e.g. spin coated, with photoresist. As a second step the wafer is exposed with a mask with the desired pattern period to UV light. The third step consists of developing the pattern using a solvent that leaves the desired photoresist pattern on the wafer. The next step is to etch the wafer using a dry etch process, e.g., ICP, to transfer the pattern into the wafer revealing both bottom and top orientations with opposite crystal polarities (See FIG. 9—steps 3 and 4).

II. Some Theoretical Considerations and Remarks on the Major Advantages of the Proposed Approach In the traditional wafer bonding technique the deposition of an inverted layer is made by MBE in a homoepitaxial process. This means that the substrate and the grown layer are from one and the same material with about the same crystalline and surface quality, because MBE is known as a growth process that provides good layer quality. This strongly simplifies the deposition process, however, at the expense of an unconditional acceptance of the quality of the available substrates, which is reflected in the quality of the growing layer. From this point of view, MBE is to some extent a good deal, because the initiation of growth does not rely solely on surface defects. This is because MBE is a far-from-equilibrium process wherein high supersaturation conditions facilitate the nucleation; nucleation can now start not only around surface defects but also elsewhere on the substrate surface. This means that MBE is not as sensitive to the initial substrate quality as HVPE is, bearing in mind that this advantage works well in both directions—when the surface defects are not enough or when they are too much for a close-to-equilibrium process; one way or another the nature of the far-from-equilibrium process, coming with the massive nucleation everywhere on the substrate surface will prevail over any other growth mechanism.

On the other side, in this disclosure we have combined two growth processes: the MOCVD heteroepitaxy of GaP/Si (as an example) and the HVPE homoepitaxy of GaP/GaP. Similar by nature to MBE the MOCVD far-from-equilibrium technique eliminates a lot of complications (already discussed) related to the close-to equilibrium processes such as HVPE. Plus, heteroepitaxy was already proven to work in the less favorable case of HVPE GaP/GaAs (much larger lattice mismatch). This means that at the much closer lattice match of GaP and Si in combination with the choice of the proper growth technique, the MOCVD shall result in good GaP layer quality when deposited on Si. On the other hand, the following thick HVPE homoepitaxy of GaP on the previously-deposited high quality MOCVD GaP/Si shall not have any problems. This indicates that the choice of the growth techniques as well their specific combination is as important as the choice of the materials for the heteroepitaxy.

MOCVD or MBE may be the preferred technique of GaP/Si heteroepitaxy for several reasons: First of all, the growth of GaP on Si immediately sets some new considerations and requirements. For example, if the lattice mismatch between GaP and Si is small, the thermal mismatch is not. This definitely will create problems, (e.g. highly strained films, or even cracking), if the layer is thick. This means we may prefer to grow thin rather than thick GaP/Si—a case in which both MBE and MOCVD would be a good choice, as far as MBE and MOCVD are traditional techniques for thin growth. In addition, as was already mentioned, as a close-to-equilibrium process, e.g. HVPE, relies mostly on natural surface defects such as, for example, the ends of screw dislocations, or purposely created "defects" (such as monoatomic terraces on miscut substrates. So, if we choose HVPE, the substrate material should be either miscut (which is not acceptable for the wafer bonding procedure) or should be of such a quality that provides enough surface defects that will trigger the growth (which in the case of Si substrate is not practical because of their high quality—see Table 3). At the same time the surface defects should just be enough for growth but not too much. Otherwise, the initial nucleation and growth that start around defects such as, for example, ends of screw dislocations will continue with the formation of bigger 3D features and finally will result in extensive hillock growth, i.e. rough surface morphology, especially in the case of "on-axis" substrates.

In contrast to the traditional wafer bonding technique for the preparation of OP templates, in this disclosure MOCVD is preferred instead of MBE for reasons explained below:

First of all, MBE and MOCVD are quite similar techniques—they both are far-from-equilibrium processes, both provide high supersaturation conditions. These factors, according to some crystal growth considerations, favor 2D "layer-by-layer" growth rather than 3D island growth. Thus the typical result from such growth experiments is a smooth surface morphology, which is a necessity for the follow-on thick HVPE growth. In addition, both techniques provide layers with uniform thickness, which reduces concerns about controlling the thickness of the inverted layer.

MOCVD, however, may be considered as a more "industrial" process, in contrast to MBE which may be considered as a more "scientific", research, or "laboratory" process. For example, MOCVD may be scaled-up to simultaneous growth on many (10 or more) wafers in one deposition process, while one is the typical limit for an MBE reactor. In this MOCVD sounds like a better alternative to the wafer bonding process, which also can be considered as a more industrial process with the real possibilities for upgrading to multi-wafer processing.

While the MOCVD technique ensures a uniform thickness of the inverted layer without the need of the deposition of an "etch-stop" layer, the choice of Si as a substrate hides another great advantage—as far as Si can be easily, quickly, and entirely etched by a chemical that is harmless to the GaP-inverted layer, we entirely eliminate the need for time consuming, demanding, and expensive polishing procedures. At the same time, etching the Si part of the bond reveals an "untouched" GaP layer surface underneath which is as smooth as the original Si wafer, which should be nearly free of mechanical strain and surface imperfections that could otherwise originate from any polishing procedure.

Herein we present a simplified, improved technique for wafer bonding of semiconductor materials with common substrates that eliminates some major issues of the traditional wafer bonding technique. Bonding of GaP with a Si substrate for the purpose of fabrication of OPGaP templates with applications in frequency conversion QPM devices is given as an example. This invention solves numerous problems, including poor GaP surface quality expressed by its high EPD, poor wafer parallelism, and the absence of an "etch-stop" material for GaP that results in an inability to secure the thickness of the inverted layer. However, other suitable heteroepitaxial cases, for example OPGaAs templates prepared by bonding to Ge wafers, or OPZnSe templates prepared by bonding to GaAs wafers, and others should be also included in this case.

The proposed approach may be used to secure the thickness of the inverted layer simply by the choice of a suitable growth technique, such as MOCVD, which is known as a technique for growth of layers with uniform thickness and smooth surface morphology.

The suitable combination of a close-to-equilibrium process, e.g. MBE or MOCVD, with a far-from-equilibrium process, e.g. HVPE, may be used advantageously to produce high quality thin or thick heterostructures. These heterostructures consist of two layers of the-same-material—one thin layer which is heteroepitaxially grown directly on the common substrate, and one thicker layer which is homoepitaxially grown on the first layer. While the role of the first layer is to absorb the strain between the two materials (which may be due to their lattice and thermal mismatches) and thus to ensure a smooth transition between them, the role of the second near strain—free thick layer is to be the host for the fabricated pattern.

The disclosed approach eliminates the need for polishing the structure before or after bonding, or during or after any other step of the (OP) template preparation, replacing it with etching. Thus the presence of mechanical strain or surface imperfections that may be caused by the polishing procedures is entirely eliminated.

The disclosed technique is to a great extent universal, i.e. it may be applied to other materials and numerous heteroepitaxial choices.

The proposed approach is an open-concept approach having numerous variations which may easily lead to a multitude of practical applications that are far beyond the scope of this disclosure.

The proposed technique with all its variations is an original approach, contrary to the techniques known in the art.

The invention described here is focused on a new concept for wafer bonding of OP and, in general, patterned templates that may be used as the foundation for the fabrication (growth) of thick QPM structures with applications in frequency conversion devices. This is an open concept with many alternative variations that will easily lead to many other, different, applications, e.g. optoelectronic applications. Thus the expectations are that the proposed approach, using different configurations and different aspects of the ideas included in this invention disclosure will have an instant impact on several different R & D areas.

As it was already mentioned the proposed invention is an open concept. For example, although the fabrication of OP templates through wafer bonding is the focus, other variations of the method like thick HVPE growth on thin MOCVD layer deposited in advance on a common substrate are also provided. At the same time although some typical material examples are used (GaP/Si) to prove the applicability of the proposed approach, other materials and heteroepitaxial cases such as GaAs/Ge or ZnSe/GaAs, and others are also brought to the reader's attention. This not only does not detract the importance of the pawned ideas but, on the contrary, adds more values to the invention and leaves the correct impression that this invention is to some extent universal.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method for preparation of orientation-patterned (OP) templates, comprising the steps of:
    a) depositing a first layer of a first material on a common substrate by a far-from-equilibrium process, wherein the common substrate material is germanium (Ge), GaP, GaSb, InAs, InP, CdTe, CdS, CdSe, or GaSe; and
    b) depositing a first layer of a second material on the first layer of the first material by a close-to-equilibrium process, wherein a first assembly is formed, wherein the first material deposited on the common substrate is one or more electronic or optical binary materials from the group consisting of GaP, InP, GaAs, InAs, AlAs, ZnSe, GaSe, ZnTe, CdTe, HgTe, GaSb, SiC, CdS, CdSe, or their ternaries or quaternaries.

2. The method for preparation of orientation-patterned templates of claim 1, wherein the first material and the second material are the same material or different materials.

3. The method for preparation of orientation-patterned templates of claim 1, wherein the first layer of the first material is a material that is different from that of the substrate material.

4. The method for preparation of orientation-patterned templates of claim 1, wherein the first layer of the second material deposited on the first layer of the first material is a material that is the same as the first layer of the first material and different from that of the substrate material.

5. The method for preparation of orientation-patterned templates of claim 1, wherein the far-from-equilibrium process is one of MOCVD and MBE.

6. The method for preparation of orientation-patterned templates of claim 1, wherein the close-to-equilibrium process is HVPE.

7. The method for preparation of orientation-patterned templates of claim 1, further comprising:
    c) determining the polarity of a top layer of the first assembly;
    d) determining the polarity of a top layer of a second assembly;
    e) bonding the top layer of the first assembly to the top layer of the second assembly so that the polarities of the bonded layers are opposites, to make a bonded pair.

8. The method for preparation of orientation-patterned templates of claim 7, wherein step e) further comprises:
    e1) applying pressure and temperature to bond the top layer of the first assembly to the top layer of the second assembly with opposite polarities.

9. The method for preparation of orientation-patterned templates of claim 7, further comprising:
    f) removing from the bonded pair the substrate corresponding to the first assembly to expose a top surface of the bonded layers.

10. The method for preparation of orientation-patterned templates of claim 9, further comprising:
    f1) removing from the bonded pair the substrate corresponding to the second assembly.

11. The method for preparation of orientation-patterned templates of claim 9, further comprising:
    g) patterning the top surface of the bonded pair.

12. The method for preparation of orientation-patterned templates of claim 11, further comprising:
    g1) coating the top surface of the bonded pair with photoresist;
    g2) exposing the photoresist to a desired pattern with UV light;
    g3) developing the pattern; and
    g4) etching the pattern from the bonded pair to reveal both bottom and top orientations with opposite crystal polarities.

* * * * *